(12) United States Patent
Suzuki et al.

(10) Patent No.: US 11,158,246 B2
(45) Date of Patent: *Oct. 26, 2021

(54) DISPLAY PANEL, DISPLAY DEVICE, AND ELECTRONIC DEVICE

(71) Applicant: Sony Group Corporation, Tokyo (JP)

(72) Inventors: Masaki Suzuki, Tokyo (JP); Shoji Sudo, Kanagawa (JP); Yoshiyuki Ishii, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/845,705

(22) Filed: Apr. 10, 2020

(65) Prior Publication Data

US 2020/0372855 A1 Nov. 26, 2020

Related U.S. Application Data

(63) Continuation of application No. 15/746,138, filed as application No. PCT/JP2016/066945 on Jun. 7, 2016, now Pat. No. 10,657,881.

(30) Foreign Application Priority Data

Jul. 28, 2015 (JP) .............................. JP2015-148403

(51) Int. Cl.
*G09G 3/3208* (2016.01)
*G09F 9/30* (2006.01)
(Continued)

(52) U.S. Cl.
CPC .............. *G09G 3/3208* (2013.01); *G09F 9/30* (2013.01); *G09G 3/3233* (2013.01);
(Continued)

(58) Field of Classification Search
CPC .............. G09F 9/30; G09F 2300/0819; G09G 2300/0819; G09G 2300/0852;
(Continued)

(56) References Cited

U.S. PATENT DOCUMENTS 10,657,881 B2 * 5/2020 Suzuki ................ H01L 27/3269
2014/0284576 A1 9/2014 Sugisawa et al.
2018/0089491 A1 3/2018 Kim et al.

FOREIGN PATENT DOCUMENTS

JP 2001-195016 A 7/2001
JP 2006-091462 A 4/2006
(Continued)

OTHER PUBLICATIONS

Asano, Oct. 15, 2009, Translation of JP 2009238833 (Year: 2009).*

*Primary Examiner* — Dmitriy Bolotin
(74) *Attorney, Agent, or Firm* — Michael Best & Friedrich LLP

(57) ABSTRACT

A display device includes: a display panel including display elements each including a light emitting unit and a drive circuit for driving the light emitting unit, the display elements being arranged in a two-dimensional matrix on a substrate; and a luminance correction unit for correcting luminances of the display elements in display of an image by the display panel by correcting a gradation value of a video signal, in which a partition (60) for guiding stray light from a light emitting unit to an optical sensor (4) provided on the display panel is provided between adjacent light emitting units of the display panel, and the luminance correction unit corrects a gradation value of a video signal associated with each of the display elements on the basis of a gradation value of an uncorrected video signal and a detection result from the optical sensor.

12 Claims, 19 Drawing Sheets

(51) Int. Cl.
*H05B 33/22* (2006.01)
*G09G 3/3233* (2016.01)
*H01L 27/32* (2006.01)
*H01L 51/52* (2006.01)

(52) U.S. Cl.
CPC ......... *H01L 27/3269* (2013.01); *H05B 33/22* (2013.01); *G09G 2300/0819* (2013.01); *G09G 2300/0852* (2013.01); *G09G 2300/0861* (2013.01); *G09G 2320/029* (2013.01); *G09G 2320/043* (2013.01); *G09G 2320/0626* (2013.01); *G09G 2360/145* (2013.01); *G09G 2360/16* (2013.01); *H01L 51/5271* (2013.01)

(58) Field of Classification Search
CPC ..... G09G 2300/0861; G09G 2320/029; G09G 2320/043; G09G 2320/0626; G09G 2360/145; G09G 2360/16; G09G 3/3208; G09G 3/3233; H05B 33/22; H01L 27/3269; H01L 51/5271

See application file for complete search history.

(56) References Cited

FOREIGN PATENT DOCUMENTS

| | | |
|---|---|---|
| JP | 2007-529775 A | 10/2007 |
| JP | 2008-287141 A | 11/2008 |
| JP | 2009-238833 A | 10/2009 |
| JP | 2014-183025 A | 9/2014 |
| JP | 2015-088319 A | 5/2015 |

* cited by examiner

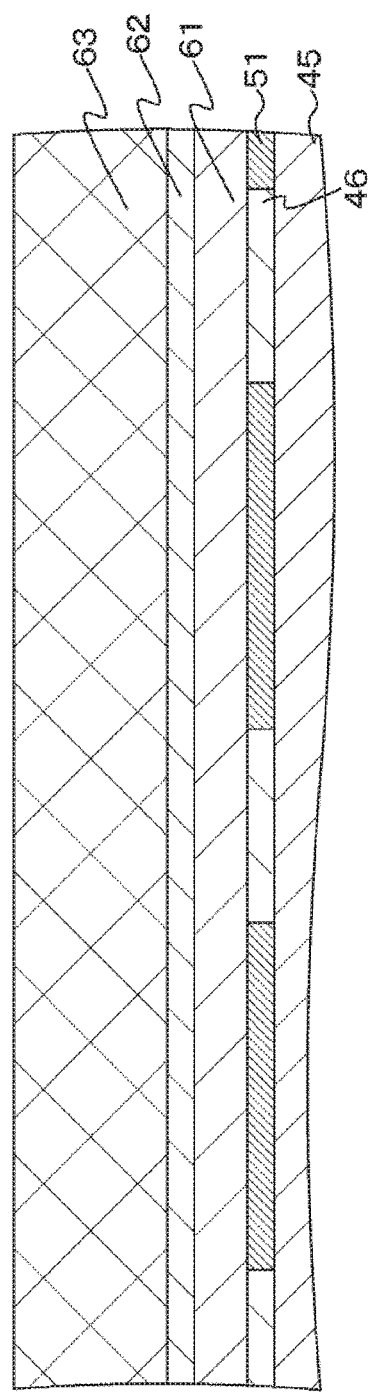
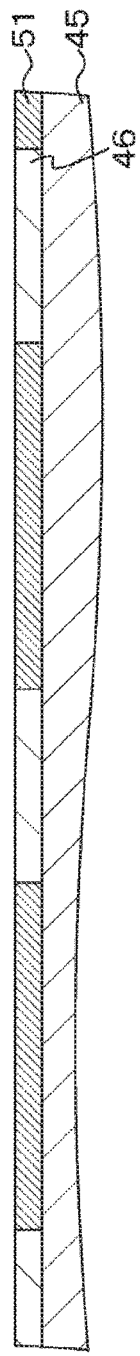
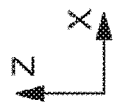

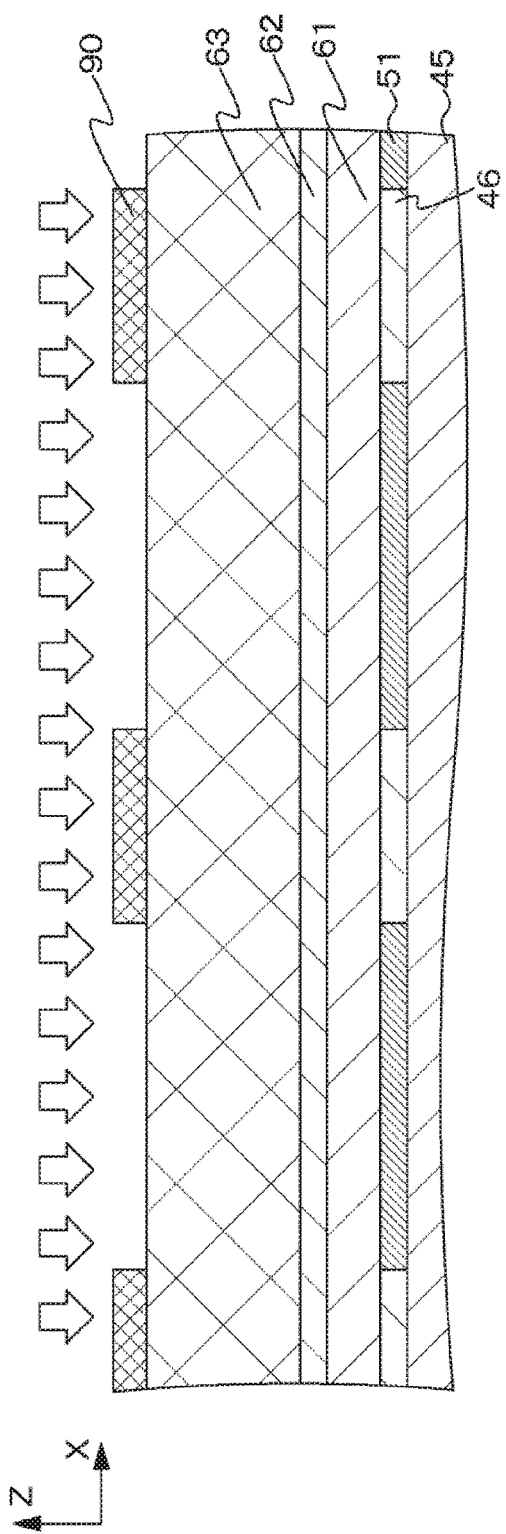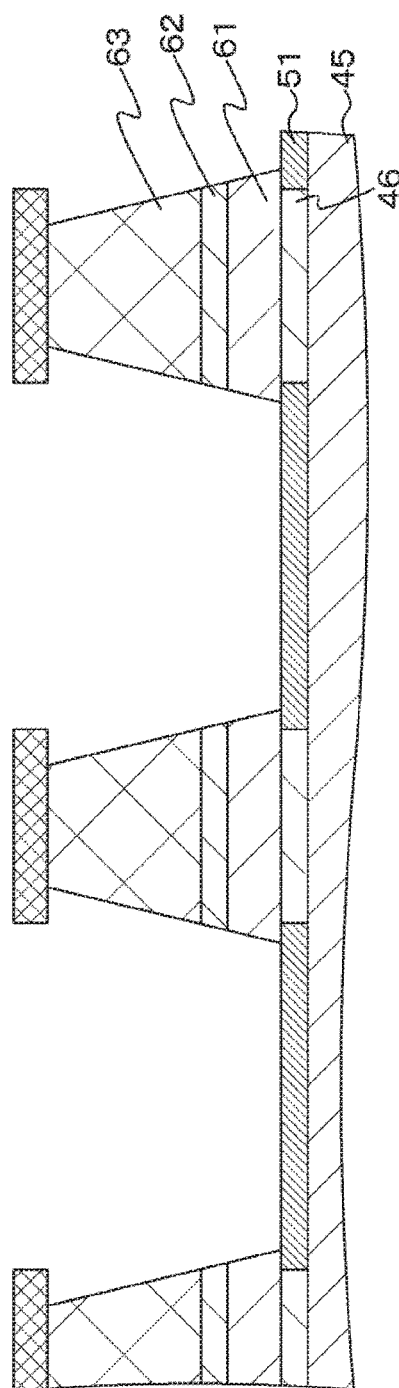

DISPLAY PANEL, DISPLAY DEVICE, AND ELECTRONIC DEVICE

CROSS REFERENCES TO RELATED APPLICATIONS

This application is a Continuation Application of patent application Ser. No. 15/746,138, filed Jan. 19, 2018, now U.S. Pat. No. 10,657,881, issued on May 19, 2020, which is the U.S. national stage entry, under 35 U.S.C. § 371 of International Application No. PCT/JP2016/066945, filed Jun. 7, 2016 which claims priority to Japanese Patent Application JP 2015-148403 filed in the Japan Patent Office on Jul. 28, 2015, the entire contents of which being incorporated herein by reference.

TECHNICAL FIELD

The present disclosure relates to a display panel, a display device, and an electronic device.

BACKGROUND ART

Display devices having display panels with organic electroluminescence are recently receiving attention as display devices replacing liquid crystal display devices. Display devices with organic electroluminescence, which have characteristics of being self-luminous and low in power consumption and are considered to have sufficient responsiveness to high-definition and high-speed video signals, have intensively been developed for practical use and commercialized. Hereinafter, display devices with organic electroluminescence may simply referred to as "display devices".

An active matrix display panel includes a plurality of display elements each including a light emitting unit and a drive circuit for driving the light emitting unit. For example, in the example illustrated in FIG. 1, a display element 3 includes a light emitting unit ELP and a drive circuit constituted by three transistors and two capacitors, which is a similar configuration to a drive circuit disclosed, for example, in Japanese Patent Application Laid-Open No. 2008-287141. The drive circuit is constituted by: a write transistor $TR_W$, a drive transistor $TR_D$, and an emission control transistor $TR_{EL}$; and a retaining capacitance $C_1$, and an auxiliary capacitance $C_2$. Note that the capacitance of the light emitting unit ELP is represented by a symbol $C_{EL}$.

CITATION LIST

Patent Document

Patent Document 1: Japanese Patent Application Laid-Open No. 2008-287141

SUMMARY OF THE INVENTION

Problems to be Solved by the Invention

The light emitting characteristics of display elements constituting a display device vary among different display elements depending on many factors such as variation in the characteristics of light emitting units, variation in the resistance of wires connected with the light emitting units, and variation in the characteristics of transistors constituting the drive circuits. These variations in the characteristics cause luminance unevenness in a display screen. Although a driving method for compensating for variation in the characteristics of transistors and the like are also proposed, the compensation is only for variation in a specific element, and therefore the effect of improvement of luminance unevenness cannot be deemed to be sufficient. For eliminating the luminance unevenness, such processes as detecting and correcting the light emitting state of each of the display elements.

An object of the present disclosure is therefore to provide a display panel capable of detecting the light emitting amount of each display element, a display device capable of correcting variation in the light emitting characteristics of the display elements with use of the display panel, and an electronic device including the display device.

Solutions to Problems

A display panel according to a first aspect of the present disclosure to achieve the aforementioned object includes display elements each including a light emitting unit and a drive circuit for driving the light emitting unit, the display elements being arranged in a two-dimensional matrix on a substrate, in which a partition for guiding stray light from a light emitting unit to an optical sensor provided on the display panel is provided between adjacent light emitting units.

A display device according to the first aspect of the present disclosure to achieve the aforementioned object includes: a display panel including display elements each including a light emitting unit and a drive circuit for driving the light emitting unit, the display elements being arranged in a two-dimensional matrix on a substrate; and a luminance correction unit for correcting luminances of the display elements in display of an image by the display panel by correcting a gradation value of a video signal, in which a partition for guiding stray light from a light emitting unit to an optical sensor provided on the display panel is provided between adjacent light emitting units of the display panel, and the luminance correction unit corrects a gradation value of a video signal associated with each of the display elements on the basis of a gradation value of an uncorrected video signal and a detection result from the optical sensor.

A display device according to the first aspect of the present disclosure to achieve the aforementioned object is an electronic device including a display device, in which the display device includes: a display panel including display elements each including a light emitting unit and a drive circuit for driving the light emitting unit, the display elements being arranged in a two-dimensional matrix on a substrate; and a luminance correction unit for correcting luminances of the display elements in display of an image by the display panel by correcting a gradation value of a video signal, in which a partition for guiding stray light from a light emitting unit to an optical sensor provided on the display panel is provided between adjacent light emitting units of the display panel, and the luminance correction unit corrects a gradation value of a video signal associated with each of the display elements on the basis of a gradation value of an uncorrected video signal and a detection result from the optical sensor.

Effects of the Invention

With the display panel according to the first aspect of the present disclosure, the light emitting amount of each of the display elements is detected with use of stray light from the light emitting units. With the display panel or the electronic device according to the first aspect of the present disclosure, the gradation value of a video signal can be corrected on the basis of a detection result, which enables correction of the luminance unevenness. In addition, the effects mentioned in the present disclosure are exemplary only and are not limiting, and additional effects may also be produced.

BRIEF DESCRIPTION OF DRAWINGS

FIGS. 4A and 4B are partial schematic end views of a substrate and other parts for explaining a method for forming partitions.

FIGS. 5A and 5B are partial schematic end views of the substrate and other parts for explaining the method for forming the partitions following FIG. 4A.

FIG. 17 illustrates external views of a single-lens reflex digital still camera with interchangeable lenses, in which

MODE FOR CARRYING OUT THE INVENTION

Figure 1:
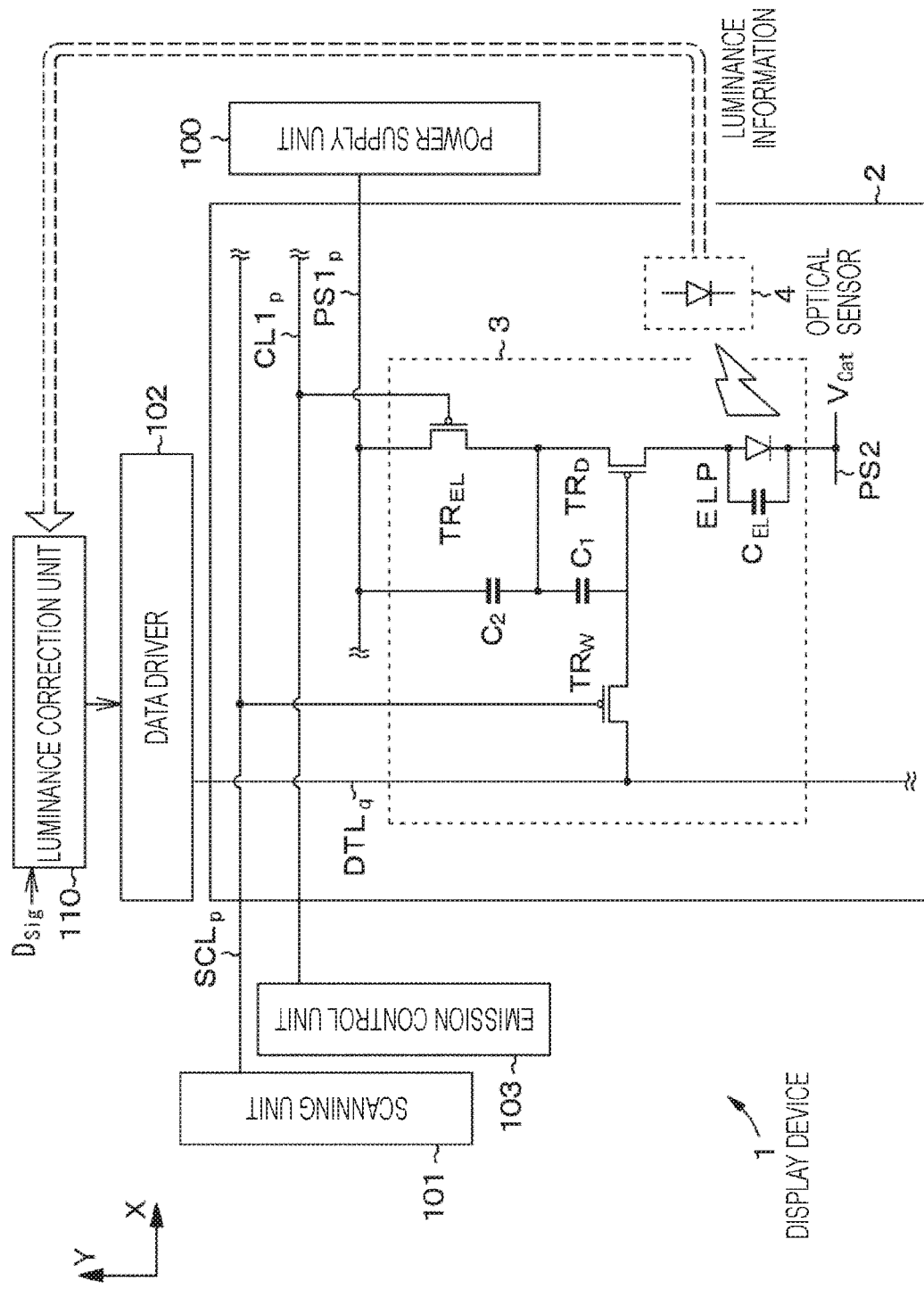
FIG. 1 is a conceptual diagram of a display device according to a first embodiment.

The present disclosure will now be described in connection with embodiments with reference to the drawings. The present disclosure is not limited to the embodiments, but various numerical values and materials in the embodiments are merely examples. In the description below, the same elements or elements having the same functions will be designated by the same reference numerals, and redundant description will not be repeated. Note that the description will be made in the following order.

1. Overall description of display panel, display device, and electronic device according to present disclosure
2. First embodiment
3. Second embodiment
4. Third embodiment and modifications thereof
5. Fourth embodiment
6. Fifth embodiment
7. Sixth embodiment
8. Description of electronic device, and others 1. Overall Description of Display Panel, Display Device, and Electronic Device According to Present Disclosure According to Present Disclosure In a display panel according to a first aspect of the present disclosure, a display panel used in a display device according to the first aspect of the present disclosure, and a display panel used in an electronic device according to the first aspect of the present disclosure (hereinafter may be simply referred to as a "display panel according to the present disclosure") a cross section of a partition taken along a virtual plane perpendicular to the longitudinal direction of the partition can have a tapered shape with the width decreasing toward a display surface side or a tapered shape with the with increasing toward the display surface side. In this case, the partition can include a stacked structure of two or more layers.

In the display panel of the present disclosure having the aforementioned preferred configuration, a protective layer covering an entire surface including spaces between partitions is provided on an upper part of the partitions, and a stacked structure constituting each of the partitions includes a material layer constituting an upper layer part, a material layer constituting a middle layer part, and a material layer constituting a lower layer part stacked in this order from a display surface side.

In this case, a configuration in which the material layer constituting the upper layer part includes a material having a refractive index lower than that of a material of the protective layer, and the material layer constituting the lower layer part includes a material having a refractive index higher than that of the material of the protective layer can be employed. Furthermore, a configuration in which the material layer constituting the middle layer part includes a material having a refractive index lower than that of the material of the lower layer part can be employed.

Alternatively, in this case, a configuration in which the material layer constituting the upper layer part includes a material having a refractive index higher than that of the protective layer, the material layer constituting the lower layer part includes the same material as the upper layer part, and the material layer constituting the middle layer part includes a material having a refractive index lower than that of the material of the upper layer part and the lower layer part can be employed.

Alternatively, in this case, a configuration in which the material layer constituting the upper layer part includes a material having a refractive index lower than that of the protective layer, the material layer constituting the lower layer part includes the same material as the upper layer part, and the material layer constituting the middle layer part includes a material having a refractive index lower than that of the material of the upper layer part and the lower layer part can be employed.

In the display panel of the present disclosure having any of the preferred configurations as described above, a configuration in which a cross-sectional shape of an interface between the lower layer part and the middle layer part taken along a virtual plane perpendicular to the longitudinal direction of the partition has at least one bent portion may be employed.

Alternatively, in the display panel of the present disclosure, a configuration in which a protective layer covering an entire surface including spaces between partitions is provided on an upper part of the partitions, a stacked structure constituting each of the partitions includes a material layer constituting an upper layer part and a material layer constituting a lower layer part stacked in this order from a display surface side, the material layer constituting the lower layer part includes a material having a refractive index higher than that of a material of the protective layer, and the material layer constituting the upper layer part includes a material having a refractive index higher than that of the material of the lower layer part can be employed.

Alternatively, in the display panel according to the present disclosure, a configuration in which the cross section of each of the partitions taken along the virtual plane perpendicular to the longitudinal direction of the partition has a tapered shape with a width increasing toward the display surface, a protective layer covering an entire surface including spaces between partitions is provided on an upper part of the partitions, the partitions are each constituted by a single material layer, and a material layer constituting the partitions includes a material having a refractive index higher than that of a material of the protective layer can be employed.

In the display panel of the present disclosure including any of the preferred configurations as described above, a configuration in which the display elements are formed on a semiconductor substrate, and optical sensors are respectively formed in association with the display elements on the semiconductor substrate can be employed.

In addition, in the display panel of the present disclosure including any of the preferred configurations as described above, a configuration in which the partitions and the optical sensors are arranged so that stray light from a display element is guided to an optical sensor associated with the display element and that stray light from a display element not being associated with an optical sensor is not guided to the optical sensor can be employed.

The partitions can be formed with use of materials appropriately selected from known inorganic materials and organic materials, by a combination of a known film forming method such as physical vapor deposition methods (PVD methods) exemplified by a vacuum deposition method and a sputtering method, various chemical vapor deposition methods (CVD methods) and the like with a known patterning method such as an etching method and a liftoff method, for example. In view of the accuracy of film formation and the control of refractive indices, an inorganic material such as silicon oxide or metal oxide is preferable.

Known sensors such as photodiodes and phototransistors can be used for the optical sensors. Note that a configuration in which optical sensors that are members separate from a display panel are disposed may be employed, but, in terms of manufacture, it is preferable that a configuration in which optical sensors and a display panel are integrated with use of semiconductor elements of the same type as those (transistors constituting drive circuits for driving light emitting units, for example) constituting display elements be employed.

A correction luminance unit included in the display device can be constituted by a computing circuit, a storage device (memory), and the like, and can be provided with use of known circuit elements and the like. Note that a power supply unit, a scanning unit, a data driver, and an emission control unit illustrated in FIG. 1 can also be provided with use of known circuit elements.

A display panel of the present disclosure including the above-described preferred configuration may have a so-called monochrome display configuration or may have a color display configuration.

In a case of the color display configuration, one pixel can be constituted by a plurality of subpixels; specifically, one pixel can be constituted by three subpixels, which has a red light emitting subpixel, a green light emitting subpixel, and a blue light emitting subpixel. Furthermore, one pixel can be constituted by a set of subpixels obtained by further adding one or more kinds of subpixels to the three kinds of subpixels (for example, a set obtained by adding a subpixel to emit white light to improve the luminance, a set obtained by adding a subpixel to emit a complementary color to increase the color reproduction range, a set obtained by adding a subpixel to emit yellow to increase the color reproduction range, or a set obtained by adding subpixels to emit yellow and cyan to increase the color reproduction range).

Examples of the values of pixels of the display device include some resolutions for image display such as (1920, 1035), (720, 480), and (1280, 960) in addition to VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536), but the pixel values are not limited to these values.

In a display device according to the present invention, examples of the light emitting units constituting the display elements include organic electroluminescent light emitting units, LED light emitting units, and semiconductor laser light emitting units. These light emitting units can be obtained with use of known materials and methods. In terms of configuration of a flat display device, the light emitting units are preferably constituted by organic electroluminescent light emitting units. The light emitting units are preferably of a so-called surface-emitting type. A light emitting unit with organic electroluminescence can be constituted by an anode electrode, a hole transport layer, a light emitting layer, an electron transport layer, a cathode electrode, and the like.

The display elements constituting the display panel are formed within a certain plane (on a substrate, for example), and a light emitting unit is formed above a drive circuit for driving the light emitting unit with an interlayer insulating layer therebetween, for example.

The configuration of transistors constituting a drive circuit for driving a light emitting unit is not particularly limited. The transistors may be p-channel field-effect transistors or n-channel field-effect transistors.

Examples of a material for the substrate include a glass material, a plastic material, and a semiconductor material. For example, in a case where a drive circuit is constituted by thin film transistors or the like, the drive circuit can be formed by using a substrate including a glass material or a plastic material and forming a semiconductor film on the substrate. In contrast, in a case where a drive circuit is constituted by transistors formed on a semiconductor substrate, a configuration in which well regions are formed in the semiconductor substrate including silicon, for example, and transistors may be formed in the well regions. Note that various wires in the display elements and the display panel can have known configurations and structures.

Conditions represented by various expressions in the present specification are satisfied in a case where the expressions are substantially satisfied, in addition to a case where the expressions are strictly satisfied in a mathematical sense. For satisfaction of the expressions, the presence of various variations caused by the design or the manufacture of the display elements, the display panel, and the like is allowed. In addition, drawings used in the description below are schematic. For example, FIG. 3, which will be described later, illustrates a cross-sectional structure of a display panel, but does not show proportions of width, height, thickness, and the like.

First Embodiment

A first embodiment relates to a display panel, a display device, and an electronic device according to the first aspect of the present disclosure.

FIG. 1 is a conceptual diagram of the display device according to a first embodiment. The display device 1 includes a display panel 2 formed by display elements 3, each including a light emitting unit and a drive circuit for driving the light emitting unit, arranged in a two-dimensional matrix, each display elements 3 being connected to a scanning line SCL extending in a row direction (X direction in FIG. 1) and a data line DTL extending in a column direction (Y direction in FIG. 1), a luminance correction unit 110 for correcting the luminances of the display elements in display of an image by the display panel by correcting the gradation values of video signals, and a data driver 102 for applying voltage to the data line DTL.

The display panel 2 is provided with optical sensors 4 associated with the respective display elements 3. A partition 60 for guiding stray light from the light emitting units to the optical sensors 4 provided on the display panel 2 is provided between adjacent light emitting units, which will be described in detail later with reference to FIG. 3.

A scanning signal from a scanning unit 101 is supplied to the scanning line SCL. Note that, for convenience of illustration, FIG. 1 illustrates one display element 3, or more specifically, connections of a (q, p)-th display element 3, which will be described later.

The display panel 2 further includes an emission control line CL1 and a power supply line PS1 connected with the display elements 3 arranged in the row direction, and a common power supply line PS2 connected in common with all the display elements 3. A control signal from an emission control unit 103 is supplied to the emission control line CL1. A predetermined drive voltage from a power supply unit 100 is supplied to the power supply line PS1. A common voltage (ground potential, for example) is supplied to the common power supply line PS2.

Although not illustrated in FIG. 1, an area (display area) in which the display panel 2 displays an image is constituted by a total of Q×P display elements 3 arranged in a two-dimensional matrix of Q display elements 3 in the row direction and P display elements in the column direction. The number of rows of the display elements 3 in the display area is P, and the number of display elements 3 constituting each row is Q.

In addition, the number of each of the scanning lines SCL, the power supply lines PS1, and the emission control lines CL1 is P. Display elements 3 on the p-th row (where p=1, 2, ..., P) are connected with the p-th scanning line $SCL_p$, the p-th power supply line $PS1_p$, and the p-th emission control line $CL1_p$, and constitute one display element row. Note that, in FIG. 1, only the scanning line $SCL_p$, the power supply line $PS1_p$, and the emission control line $CL1_p$ are illustrated.

In addition, the number of data lines DTL is Q. Display elements 3 on the q-th column (where q=1, 2, ..., Q) are connected with the q-th data line $DTL_q$. Note that only the data line $DTL_q$ is illustrated in FIG. 1.

The display device 1 is a monochrome display device, for example, in which one display element 3 constitutes one pixel. The display device 1 is line-sequentially scanned in units of rows by a scanning signal from the scanning unit 101. A display element 3 located on the p-th row and the q-th column will hereinafter be referred to as the (q, p)-th display element 3 or the (q, p)-th pixel.

In the display device 1, the display elements 3 respectively constituting Q pixels arranged on the p-th row are driven at the same time. In other words, emitting/non-emitting timings of Q display elements 3 arranged along the row direction are controlled in units of rows to which the display elements belong. When the display frame rate of the display device 1 is represented by FR (times/second), the scanning period per row (so-called horizontal scanning period) in line-sequential scanning of the display device 1 in units of rows is shorter than (1/FR)×(1/P) seconds.

A video signal $D_{Sig}$ indicating gradation depending on an image to be displayed is input to the luminance correction unit 110 of the display device 1 from a device, which is not illustrated, for example. Since the video signal $D_{Sig}$ is a signal before being subjected to correction by the luminance correction unit 110, $D_{Sig}$ may also be referred to as "uncorrected video signal" in the description below. Among video signals $D_{Sig}$ that are input, a video signal associated with the (q, p)-th display element 3 may be referred to as $D_{Sig(q,p)}$.

For convenience of description, the gradation bit length of the video signal $D_{Sig(q,p)}$ is assumed to be 11 bits, and the maximum value of a correction factor $[k_{(q,p)}]$, which will be described later, is assumed to be "2". As will be described later, since a corrected video signal is represented by $k_{(q,p)} \cdot D_{Sig(q,p)}$, the gradation value of a corrected video signal is 12 bits at a maximum and is a value between 0 and 4095. Assume here that the luminance of an image to be displayed is higher as the gradation value is larger. Note that the gradation bit length mentioned above is merely an example. The gradation bit length may be 8 bits, 16, bits, 24 bits, or the like.

The display elements 3 are each constituted by a light emitting unit ELP and a drive circuit for driving the light emitting unit ELP. The light emitting unit ELP is constituted by an organic electroluminescent light emitting unit. The drive circuit is constituted by: a write transistor $TR_W$, a drive transistor $TR_D$, and an emission control transistor $TR_{EL}$; and a capacitor $C_1$ and an auxiliary capacitor $C_2$. When current flows to the light emitting unit ELP via a source/drain region of the drive transistor $TR_D$, the light emitting unit ELP emits light. Each of the transistors is constituted by a p-channel field-effect transistor. These transistors are provided on a silicon semiconductor substrate, which will be described later with reference to FIG. 3.

In a display element 3, a first source/drain region of the drive transistor $TR_D$ is connected with a second source/drain region of the emission control transistor $TR_{EL}$ and a first end of the capacitor $C_1$, a second source/drain region of the drive transistor $TR_D$ is connected with a first end (specifically, an anode electrode) of the light emitting unit ELP, and a gate electrode of the drive transistor $TR_D$ is connected with a second source/drain region of the write transistor $TR_W$ and a second end of the capacitor $C_1$.

In addition, a first source/drain region of the write transistor $TR_W$ is connected with the data line DTL, and a gate electrode of the write transistor $TR_W$ is connected with the scanning line SCL.

A first source/drain region of the emission control transistor $TR_{EL}$ is connected with the power supply line PS1, and a gate electrode of the emission control transistor $TR_{EL}$ is connected with the emission control line CL1.

The first end of the capacitor $C_1$ is further connected with the power supply line PS1 via the auxiliary capacitor $C_2$.

A second end (specifically, a cathode electrode) of the light emitting unit ELP is connected with the common power supply line PS2. A predetermined cathode voltage $V_{Cat}$ is supplied to the common power supply line PS2. Note that the capacitance of the light emitting unit ELP is represented by a symbol $C_{EL}$.

An outline of driving of the display elements 3 will be explained. When the write transistor $TR_W$ is switched to a conducting state by a scanning signal from the scanning unit 101 while a voltage depending on the luminance of an image to be displayed is supplied from the data driver 102 to the data line DTL, the voltage depending on the luminance of the image to be displayed is written into the capacitor $C_1$. After the write transistor $TR_W$ is switched to a non-conducting state, thee emission control transistor $TR_{EL1}$ is switched to a conducting state, and current depending on the voltage held by the capacitor $C_1$ flows to the drive transistor $TR_D$, which causes the light emitting unit ELP to emit light.

The light emitting characteristics of the display elements 3 vary among different display elements depending on many factors such as variation in the characteristics of the light emitting units ELP, variation in the resistance of wires connected with the light emitting units ELP, and variation in the characteristics of transistors constituting the drive circuits. This causes such a phenomenon as luminance unevenness in an image to be displayed.

Thus, in a case where the light emitting characteristics obtained by detection of the light emitting states of the light emitting units ELP of the respective display elements vary, the luminance unevenness can be reduced through such processing as multiplication of the gradation value of the video signal to compensate for the variation.

Operation of the luminance correction unit 110 illustrated in FIG. 1 will be described.

Figure 2:
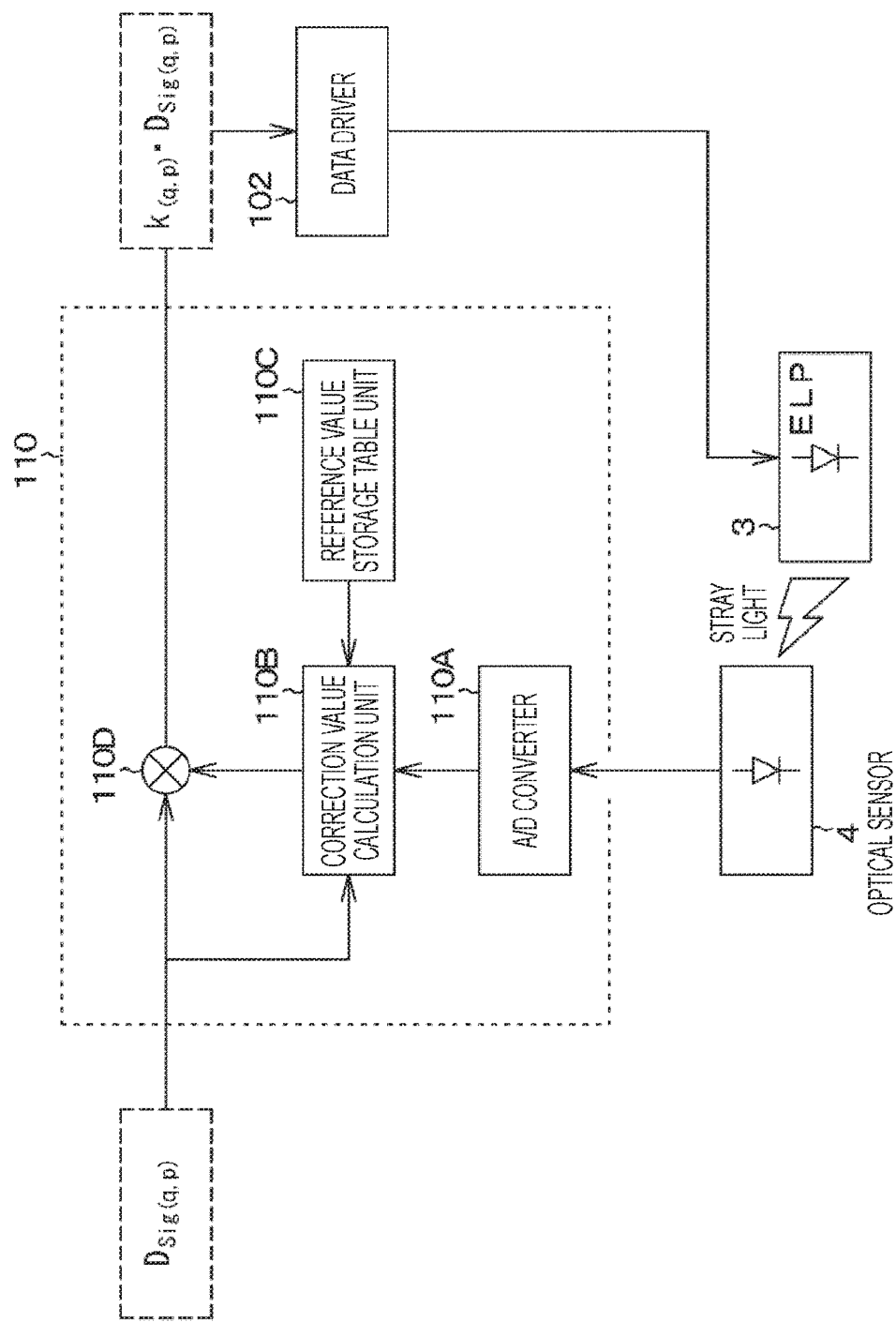
FIG. 2 is a block diagram for explaining a luminance correction unit illustrated in FIG. 1.

FIG. 2 is a block diagram for explaining the luminance correction unit illustrated in FIG. 1.

The luminance correction unit 110 is constituted by blocks such as an A/D converter 110A, a correction value calculation unit 110B, a reference value storage table unit 110C, and a multiplication unit 110D.

An optical sensor 4 receive stray light from the light emitting unit ELP of a display element 3. An output from the optical sensor 4 is digitized by the A/D converter 110A and input to the correction value calculation unit 110B. An uncorrected video signal $D_{Sig(q,p)}$ is further input to the correction value calculation unit 110B.

The reference value storage table unit 110C stores reference values to be detected by the optical sensors 4 depending on the value of the uncorrected video signal $D_{Sig(q,p)}$. The correction value calculation unit 110B compares a reference value obtained from the reference value storage table unit 110C with a numerical value input from the A/D converter to obtain the difference therebetween. A correction factor $[k_{(q,p)}]$ that compensates for the difference is then calculated, and the uncorrected video signal $D_{Sig(q,p)}$ is multiplied by the correction factor $[k_{(q,p)}]$ by the multiplication unit 110D. The corrected video signal is obtained as $k_{(q,p)} D_{Sig(q,p)}$.

The data driver 102 then generates a voltage based on the value of the signal $k_{(q,p)} \cdot D_{Sig(q,p)}$ to drive the display element 3. In this manner, the variation in the light emitting characteristics of the display elements 3 can be performed for each of the display elements.

The frequency of calculation of the aforementioned correction factor $[k_{(q,p)}]$ may be appropriately determined depending on the design and specification of the display device. For example, a mode in which an entirely white screen is displayed and a correction factor $[k_{(q,p)}]$ is calculated when the display device is powered on and the multiplication process is only performed thereafter can be employed. In this case, the calculated correction factor $[k_{(q,p)}]$ may be stored in a storage device such as a non-rewritable non-volatile memory, for example. Alternatively, a mode in which a correction factor $[k_{(q,p)}]$ is calculated at predetermined intervals during operation of the display device can be employed.

The operation of the luminance correction unit 110 illustrated in FIG. 1 has been described above. Next, a structure of the display panel will be described with reference to FIG. 3.

Figure 3:
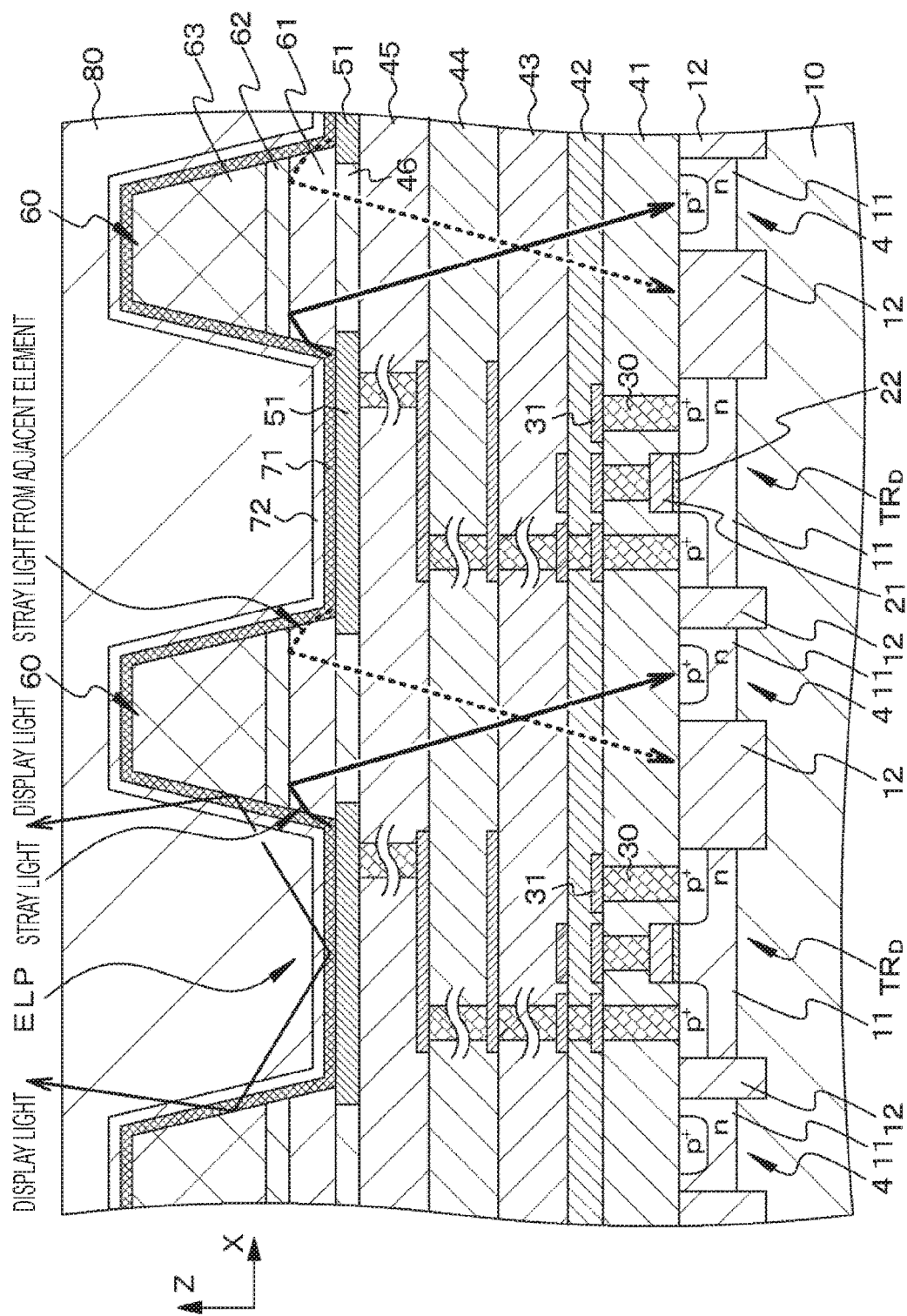
FIG. 3 is a partial schematic cross-sectional view of a display panel of the first embodiment.

FIG. 3 is a partial schematic cross-sectional view of the display panel of the first embodiment.

The drive transistor $TR_D$, the write transistor $TR_W$, and the emission control transistor $TR_{EL}$ constituting the drive circuit are provided in a n-well 11 formed on a surface of semiconductor substrate 10 including silicon. Note that, for convenience of illustration, only the drive transistor $TR_D$ is illustrated. These transistors are surrounded by an element isolation region 12. A reference numeral 21 represents a gate electrode of the drive transistor $TR_D$, and a reference numeral 22 represents a gate insulating film of the drive transistor $TR_D$.

The optical sensor 4 on the display panel are also provided in the n-well 11 similarly to the transistors constituting the drive circuit. The optical sensors 4 are constituted by photodiodes. The optical sensors 4 are also surrounded by the element isolation region 12. For convenience of illustration, connections between the optical sensors 4 and the luminance correction unit 110 illustrated in FIG. 1 are not illustrated. The display elements 3 are formed on the semiconductor substrate 10, and the optical sensor 4 are formed on the semiconductor substrate 10 in association with the respective display elements 3. In addition, the partitions 60 and the optical sensors 4 are arranged so that stray light from a display element 3 is guided to the optical sensor 4 associated with the display element 3 and that stray light from a display element 3 that is not associated with an optical sensor 4 is not guided to the optical sensor 4.

The first source/drain region of the drive transistor $TR_D$ is connected with electrodes 31 constituting wires, capacitors, or the like via contact holes 30. Reference numerals 41, 42, 43, 44, and 45 represent interlayer insulating layers. Anode electrodes 51 of the light emitting units ELP corresponding to the respective display elements 3 are formed on the interlayer insulating layer 45. The anode electrodes 51 are arranged in a two-dimensional matrix on the interlayer insulating layer 45. A reference numeral 46 represents an insulating layer filling a space between the anode electrodes 51. The anode electrodes 51 and second source/drain regions of the drive transistors $TR_D$ are connected with each other via contact holes and the like formed in the interlayer insulating layers 41, 42, 43, 44, and 45. Regions in which the anode electrodes 51 are provided correspond to regions in which the light emitting units ELP are formed.

In addition, partitions 60 for guiding stray light from the light emitting units ELP to the optical sensors 4 provided on the display panel are provided between adjacent light emitting units ELP. In the example illustrated in FIG. 3, the cross sections of the partitions 60 taken along a virtual plane perpendicular to the longitudinal direction of the partitions 60 have a tapered shape with the width decreasing toward the display surface (toward the +Z direction in FIG. 3). The partitions 60 include inorganic oxide such as silicon oxide or aluminum oxide.

In a case of a display panel having a small size and a high definition specification, the widths of the light emitting units ELP and the partitions 60 in the X direction and the heights of the partitions 60 in the Z direction have values of several μm, for example.

An organic layer 71 including light emitting layers is formed to cover the entire surface including the partitions 60 described above. Note that the organic layer 71 has a multilayer structure included a red light emitting layer, a green light emitting layer, a blue light emitting layer, and the like, but is depicted as one layer in FIG. 3. In addition, a cathode electrode 72 is formed on the entire surface of the organic layer 71. The cathode electrode 72 includes a transparent conducting material such as ITO or IZO, or a material such as MgAg, for example. A protective layer 80 is provided on the cathode electrode 72 and covers the entire surface including spaces between the partitions 60. Note that, in a case of color display, color filters are provided on the protective layer 80 and in association with the respective light emitting units ELP.

Note that the partitions 60 may be in a grid-like shape or in a band-like shape. In the case of a grid-like shape, the partitions 60 may have a shape surrounding all four sides of an ELP region in a continuous manner or in a discontinuous manner. In the case of a band-like shape, the partitions 60 may have a continuous shape or a discontinuous shape.

In the example illustrated in FIG. 3, the partitions 60 are constituted by a stacked structure of two or more layers. More specifically, the stacked structure constituting the partitions 60 includes a material layer 63 constituting an upper layer part, a material layer 62 constituting a middle layer part, and a material layer 61 constituting a lower layer part, which are stacked in this order from the display surface side.

In addition, the material layer 63 constituting the upper layer part includes a material having a refractive index lower than that of the material of the protective layer 80, and the material layer 61 constituting the lower layer part includes a material having a refractive index higher than that of the material of the protective layer 80. Furthermore, the material layer 62 constituting the middle layer part includes a material having a refractive index lower than that of the material of the lower layer part 61. For example, the material layer 61 includes SiN, the material layer 62 includes SiON, and the material layer 63 includes SiO. Note that the protective layer 80 includes SiN.

Processes for forming the partitions 60 will be described with reference to FIGS. 4 and 5. The material layer 61, the material layer 62, and the material layer 63 are sequentially stacked by a known film forming technology such as the CVD method, for example, over the entire surface including the anode electrode 51 and the insulating layer 46 (see FIGS. 4A and 4B).

Subsequently, masks 90 are formed on the material layer 63 at positions corresponding to those of the partitions 60, and a dry etching process, for example, is then performed (see FIG. 5A). The process is performed under the condition that overetching occurs, so that the partitions 60 including the material layer 61, the material layer 62, and the material layer 63 and having a tapered shape are formed at the positions of the masks 90 (see FIG. 5B).

The production of the display elements 3 described above can be conducted on the basis of a known method, and the materials used for the production of the display elements 3 can be appropriately selected from known materials.

Next, the relation between a partition 60 and the associated optical sensor 4 will be described.

As illustrated in FIG. 3, in addition to stray light (depicted by a solid line) from the light emitting unit ELP associated with the optical sensor 4, stray light (depicted by a broken line) from a light emitting unit ELP of an adjacent display element 3 enters the partition 60. The stray light beams are reflected by an interface between the material layer 61 and the material layer 62 and directed toward the semiconductor substrate 10.

Although it depends on the thicknesses of the interlayer insulating layers and the like, a difference occurs between the position at which the stray light from the light emitting unit ELP associated with the optical sensor 4 is incident on the semiconductor substrate 10 and the position at which stray light from the light emitting unit ELP of the adjacent display element 3 is incident on the semiconductor substrate 10. Thus, the optical sensor 4 is disposed at the position at which the stray light depicted by the solid line is incident, which suppresses the influence of the stray light from the adjacent light emitting unit ELP on a detection result of the optical sensor 4.

Next, positioning of the middle layer of the partition 60 will be described.

Figure 6:
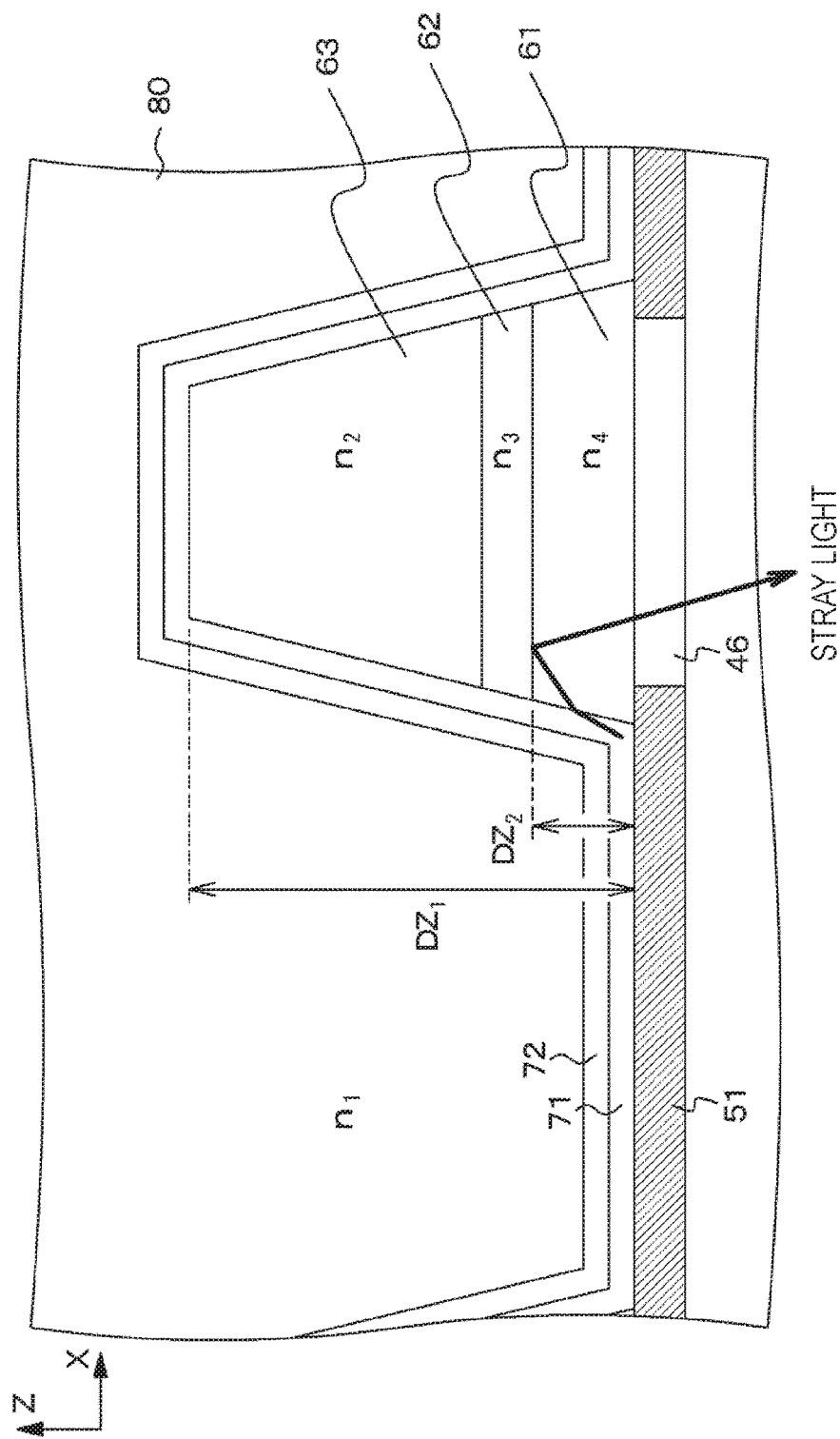
FIG. 6 is a partial schematic cross-sectional view of a display panel for explaining the relation between stray light from a light emitting unit and a middle layer part of a partition.
Figure 7:
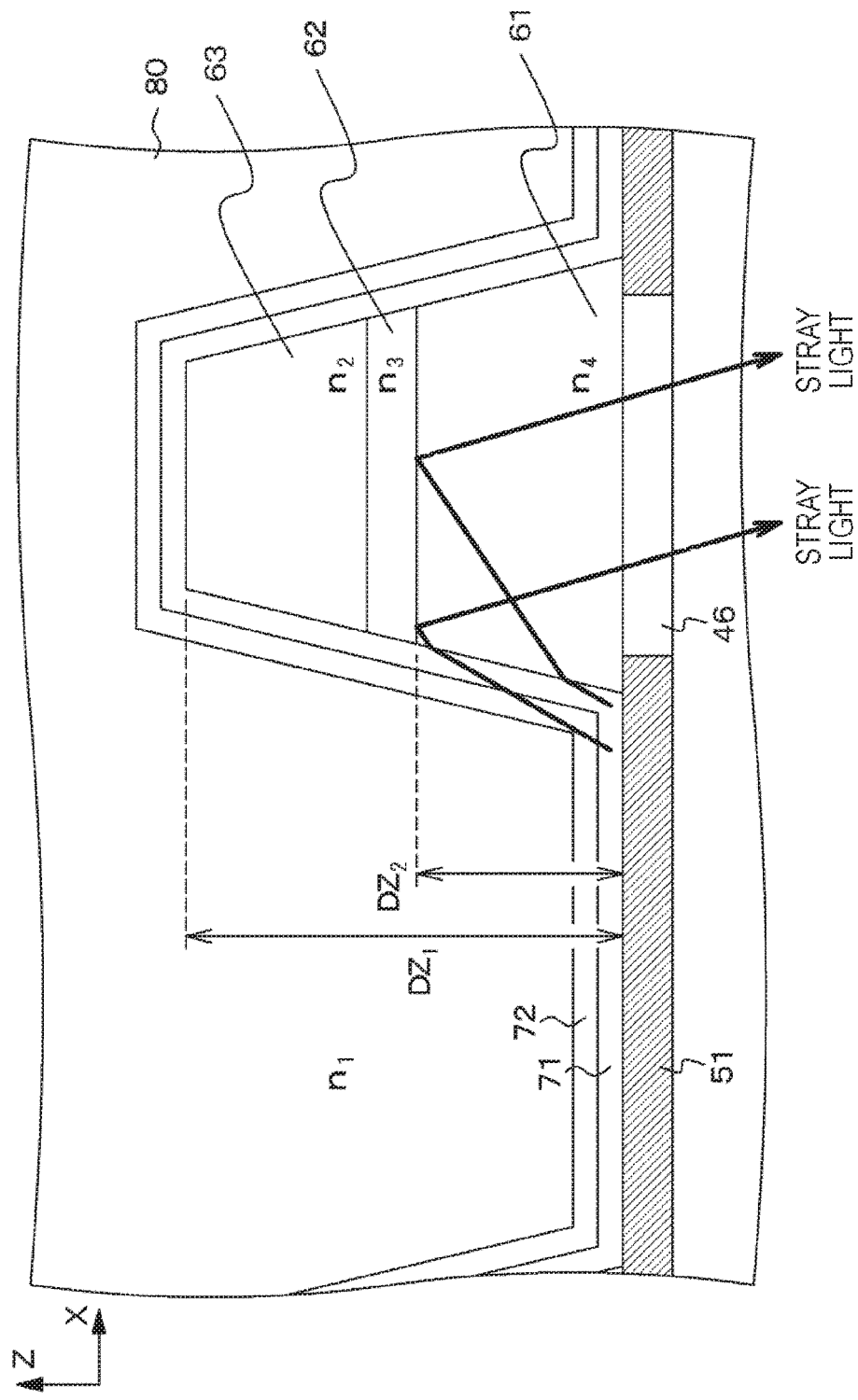
FIG. 7 is a partial schematic cross-sectional view of the display panel for explaining the relation between stray light from the light emitting unit and the middle layer part of the partition following FIG. 6.

FIG. 6 is a partial schematic cross-sectional view of the display panel for explaining the relation between stray light from the light emitting unit and the middle layer part of the partition. FIG. 7 is a partial schematic cross-sectional view of the display panel for explaining the relation between stray light from the light emitting unit and the middle layer part of the partition following FIG. 6. Note that, for convenience of description, hatching other than that for the anode electrode 51 is omitted in FIGS. 6 and 7. The same applies to other subsequent drawings.

The refractive index of the protective layer 80 covering the partition 60 is represented by a symbol $n_1$, the refractive index of the upper layer part of the partition 60 is represented by a symbol $n_2$, the refractive index of the middle layer part is represented by a symbol $n_3$, and the refractive index of the lower layer part is represented by a symbol $n_4$. As described above, the material layer 63 constituting the upper layer part includes a material having a refractive index lower than that of the material of the protective layer 80, and the material layer 61 constituting the lower layer part includes a material having a refractive index higher than that of the material of the protective layer 80. Thus, the symbol $n_2$<the symbol $n_1$, and the symbol $n_1$<the symbol $n_4$ are satisfied. Furthermore, since the material layer 62 constituting the middle layer part includes a material having a refractive index lower than that of the material of the lower layer part 61, the symbol $n_3$<the symbol $n_4$ is satisfied.

According to the Snell's law, incidence and exit of light on/from the partition 60 do not depend on the structures of the organic layer and the cathode electrode. Light incident on an inclined surface of the material layer 61 constituting the lower layer part is guided into the material layer 61, totally reflected at the interface between the material layer 62 and the material layer 61, and directed toward the semiconductor substrate. In contrast, light incident on an inclined surface of the material layer 63 constituting the upper layer part is likely to be totally reflected toward the display surface.

Thus, in a case where priority is given to the intensity of light on the display surface side, the upper layer part may be set to be relatively thicker than the lower layer part as illustrated in FIG. 6. In other words, the proportion of the height $DZ_2$ of the lower layer part to the height $DZ_1$ of the partition 60 illustrated in FIG. 6 may be set to be small. Conversely, in a case where priority is given to detection of stray light, the lower layer part may be set to be thicker as illustrated in FIG. 7. In other words, the proportion of the height $DZ_2$ of the lower layer part to the height $DZ_1$ of the partition 60 illustrated in FIG. 6 may be set to be large.

Second Embodiment

A second embodiment is different from the first embodiment in that the refractive index of the lower layer part of the partition 60 is different. The configuration of the second embodiment other than the above is similar to that of the first embodiment.

Figure 8:
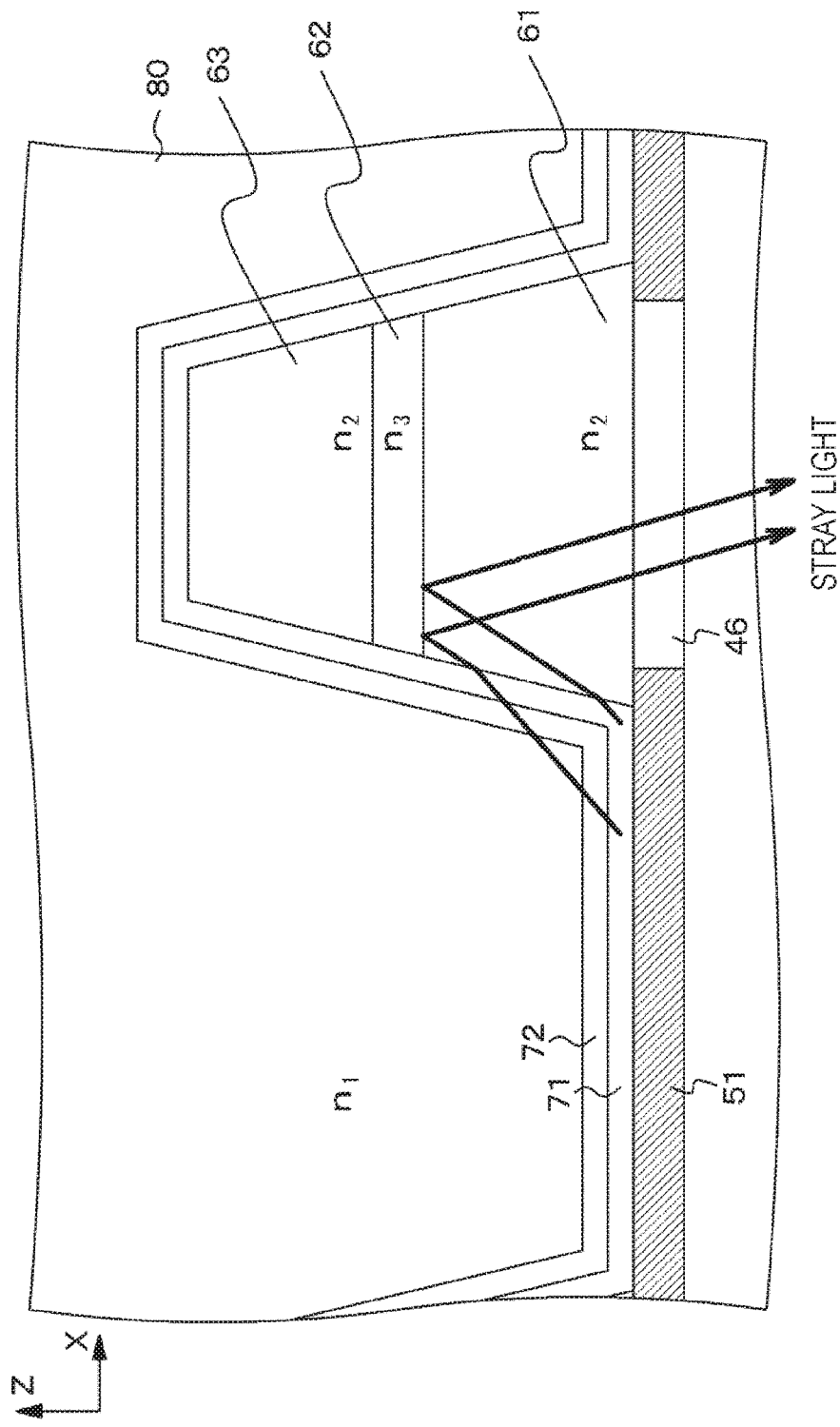
FIG. 8 is a partial schematic cross-sectional view of a display panel for explaining a partition of a second embodiment.

FIG. 8 is a partial schematic cross-sectional view of a display panel for explaining a partition of the second embodiment.

In the second embodiment, the material layer constituting the upper layer part of the partition 60 includes a material having a refractive index higher than that of the material of the protective layer 80, the material layer constituting the lower layer part includes the same material as the upper layer part, the material layer constituting the middle layer part includes a material having a refractive index higher than that of the material of the upper layer part and the lower layer part.

Thus, the refractive indices of the protective layer 80, and the upper layer part and the middle layer part of the partition 60 are represented by the symbol $n_1$, the symbol $n_2$, and the symbol $n_3$, similarly to the first embodiment. In contrast, the refractive index of the lower part of the partition 60 is represented by the symbol $n_2$. With this configuration as well, stray light from the light emitting unit ELP can be captured to some extent, and the stray light can thus be guided to the optical sensor 4.

Since the upper layer part and the lower layer part of the partition 60 can be formed through processes using the same material, the second embodiment is advantageous in that the processes can be simplified.

Third Embodiment

A third embodiment is different from the first embodiment and the second example in that interfaces between the layers of the partition 60 have bent portions. More specifically, the cross-sectional shape of the interface between the lower layer part and the middle layer part taken along a virtual plane perpendicular to the longitudinal direction of the partition 60 has at least one bent portion. The configuration of the third embodiment other than the above is similar to those of the first embodiment and the second embodiment.

Figure 9:
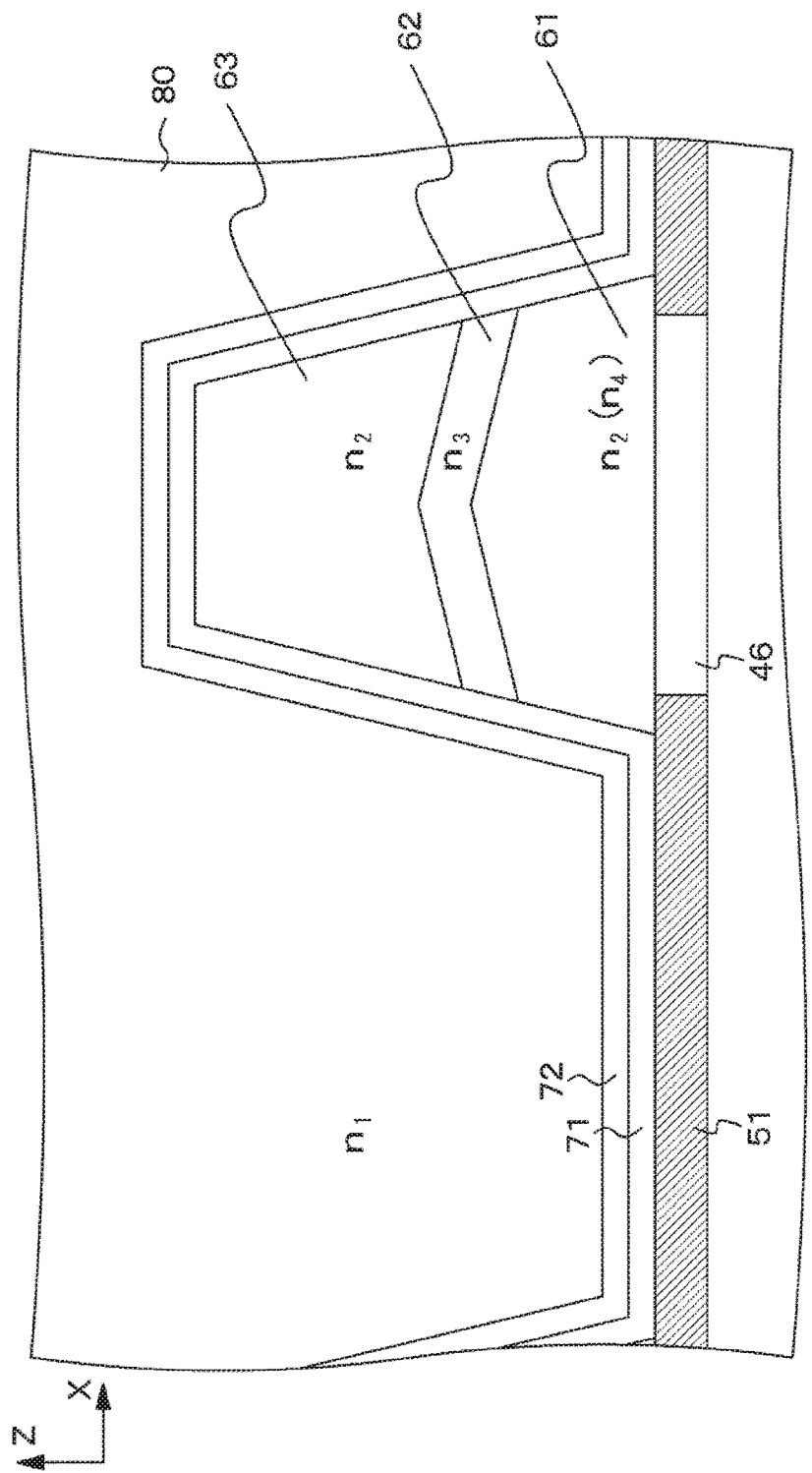
FIG. 9 is a partial schematic cross-sectional view of a display panel for explaining a partition of a third embodiment.

FIG. 9 is a partial schematic cross-sectional view of a display panel for explaining a partition of the third embodiment.

In the example illustrated in FIG. 6 or the like, the lower layer part of the partition 60 has a flat upper surface, and the middle layer part is formed to cover the flat upper surface.

Thus, the interface between the lower layer part and the middle layer part is also flat. In contrast, as illustrated in FIG. 9, the upper surface of the lower layer part of the partition 60 has a shape pointed toward the display surface in the third embodiment. Since the middle layer part is formed to cover the pointed upper surface, the cross-sectional shape of the interface between the lower layer part and the middle layer part has a bent portion.

Figure 10A:
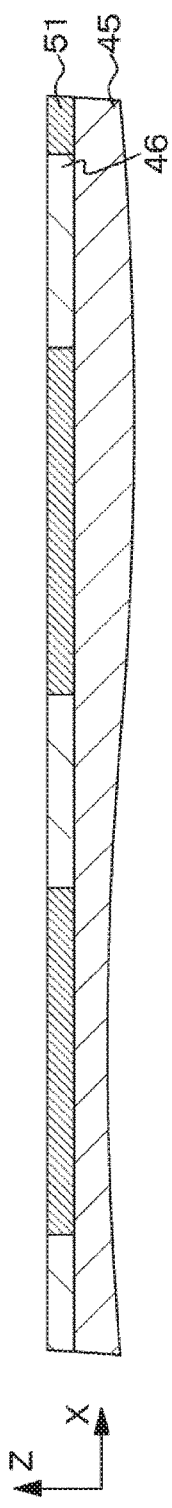
FIGS. 10A to 10C are partial schematic end views of a substrate and other parts for explaining a method for forming partitions in the third embodiment.
Figure 10B:
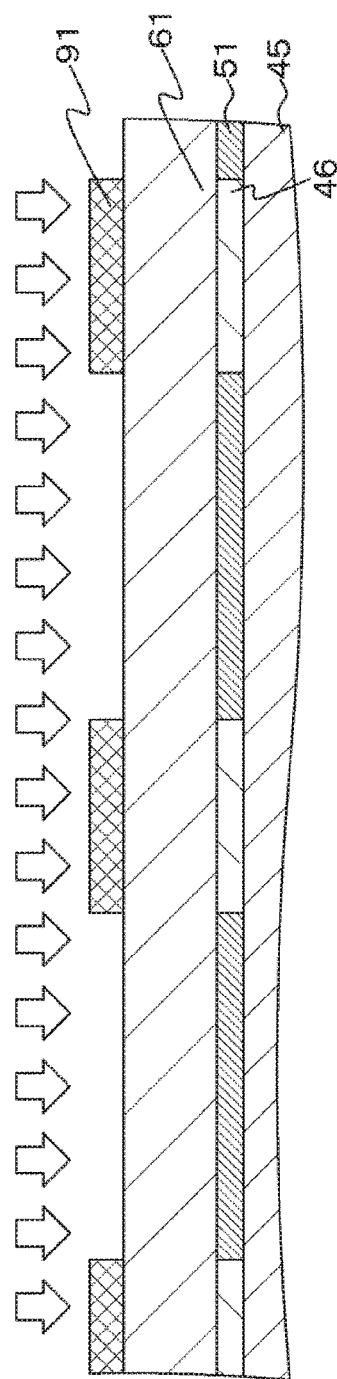
Figure 10C:
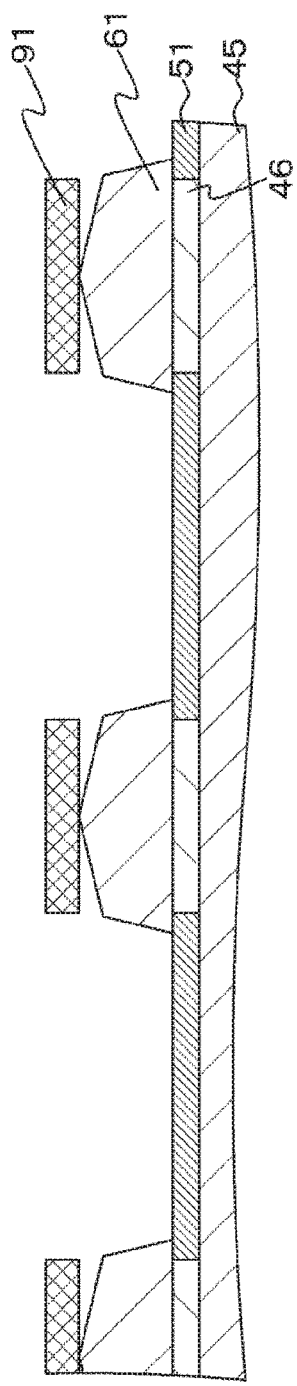

Processes for forming the partition 60 will be described with reference to FIGS. 10A to 10C. After the material layer 61 is stacked over the entire surface including the anode electrode 51 and the insulating layer 46, and after masks 91 are formed on the material layer 61 at positions corresponding to those of the partitions 60, a dry etching process, for example, is then performed (see FIGS. 10A and 10B).

The process is performed under the condition that overetching occurs, so that portions in the shade of the masks 91 are also subjected to etching, which results in that the upper surface of the lower layer part of the partition 60 has a shape pointed toward the display surface.

Thereafter, the material layer 62 and the material layer 63 are sequentially stacked over the entire surface by a known film forming technology, and a process similar to that described with reference to FIGS. 5A and 5B in the first embodiment is then performed, so that the partition 60 is formed.

In the third embodiment, the inclination of an interface at which light is reflected can be changed, so that the direction in which stray light is reflected is changed. Thus, such an effect as an increase in flexibility of positioning of the optical sensors is produced.

Figure 11:
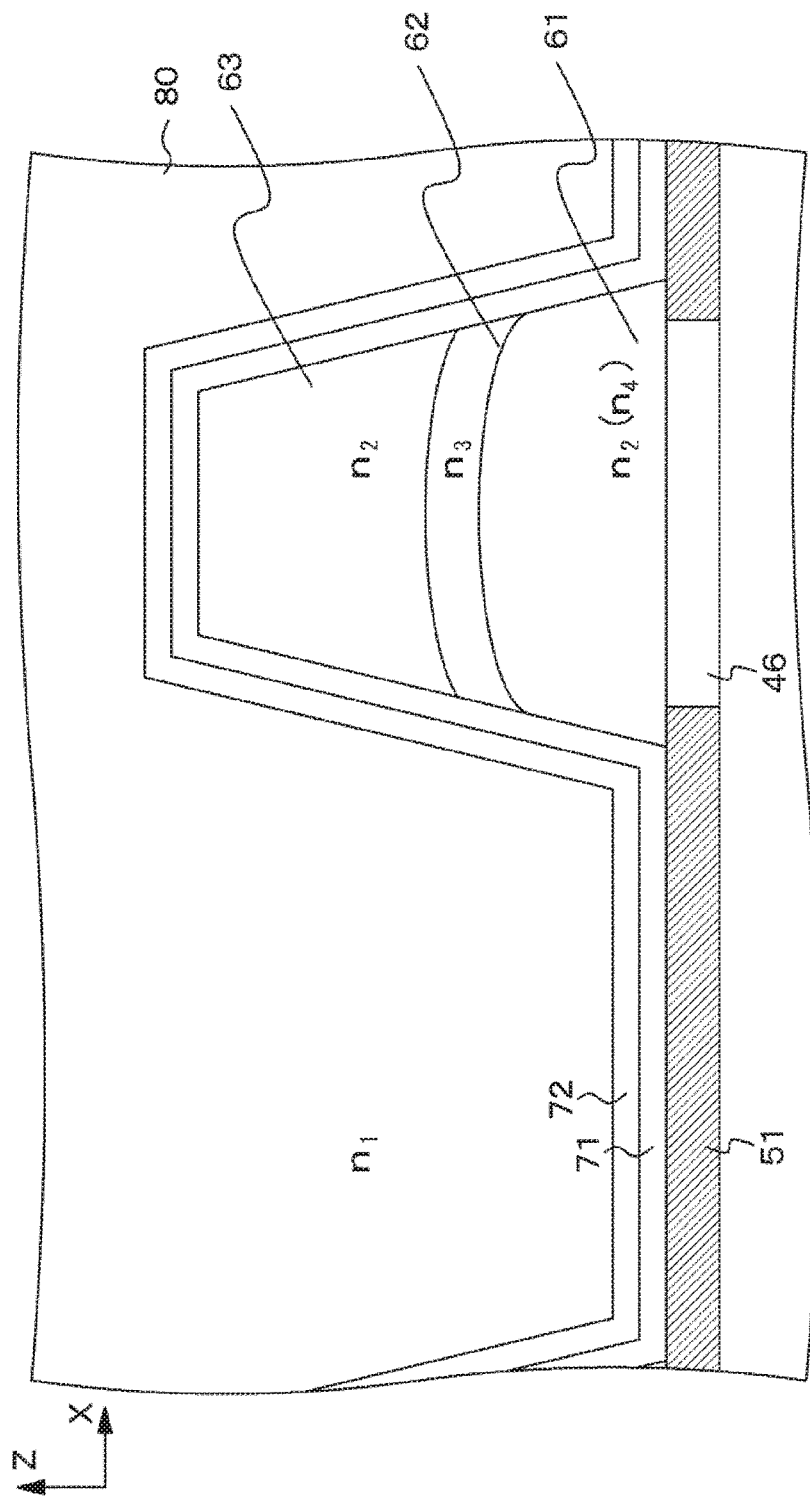
FIG. 11 is a partial schematic cross-sectional view of a display panel for explaining a partition of a modification of the third embodiment.
Figure 12:
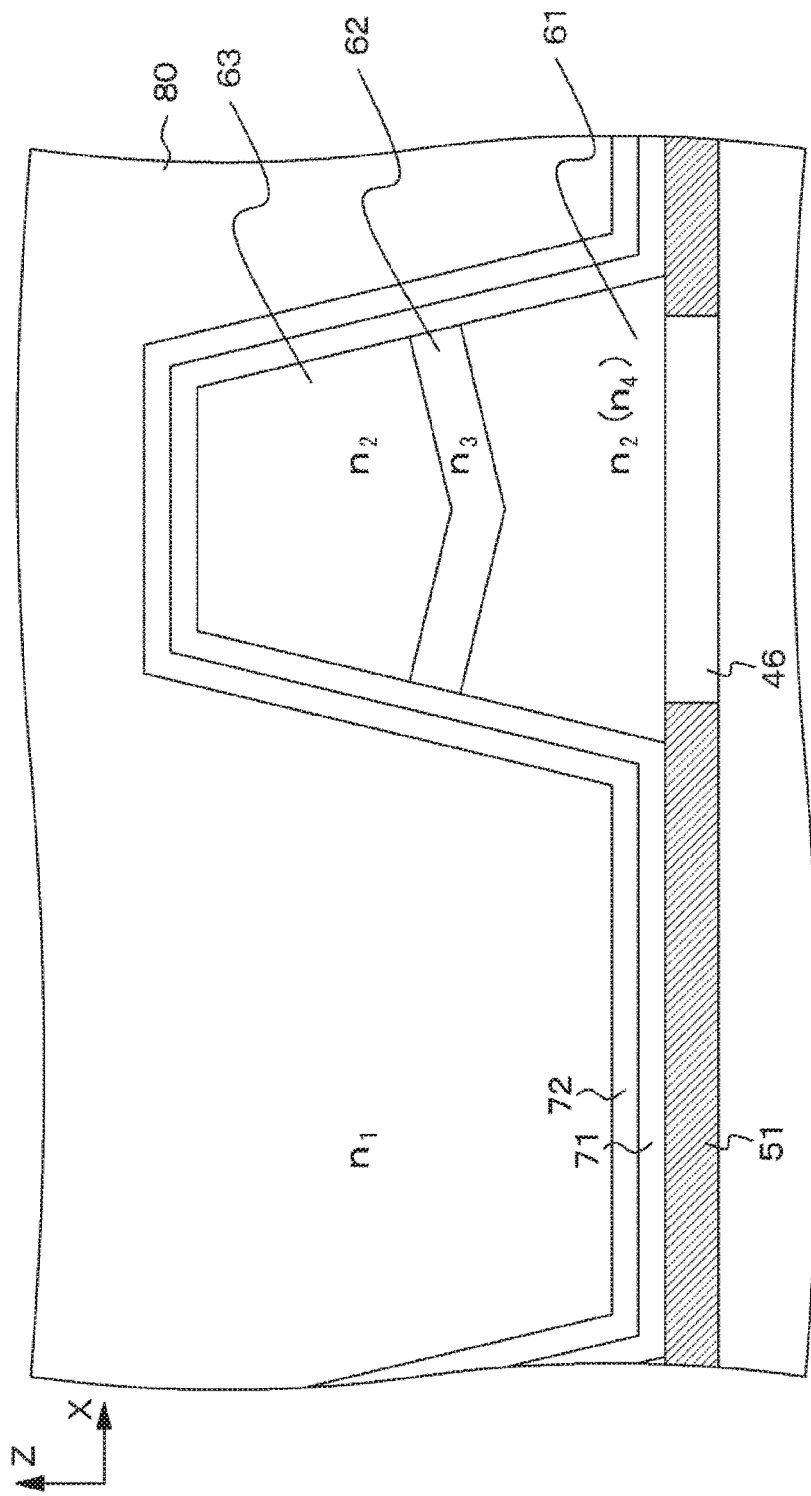
FIG. 12 is a partial schematic cross-sectional view of a display panel for explaining a partition of a modification of the third embodiment.
Figure 13:
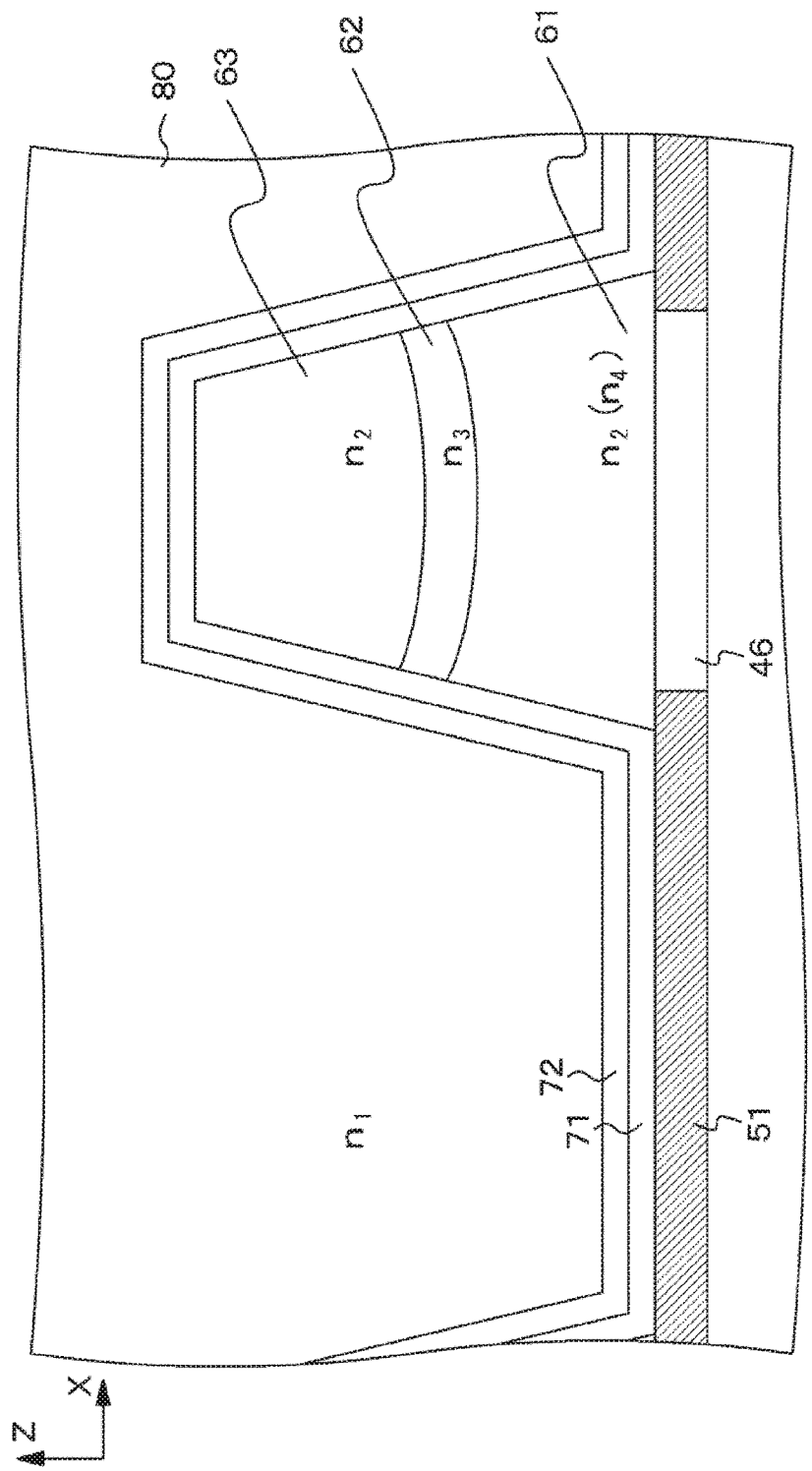
FIG. 13 is a partial schematic cross-sectional view of a display panel for explaining a partition of a modification of the third embodiment.

The third embodiment can be modified in various manners. FIGS. 11 to 13 are partial schematic cross-sectional views of display panels for explaining partitions according to modifications of the third embodiment. The modifications will hereinafter be described with reference to FIGS. 11 to 13.

An example illustrated in FIG. 11 is a modification in which the upper surface of the lower layer part of the partition 60 has a rounded convex shape. For example, the upper surface of the lower layer part of the partition 60 can be formed into a rounded shape by such a process as rounding an edge by chemical processing or the like after the process illustrated in FIG. 10C. FIG. 12 illustrates a modification in which the upper surface of the lower layer part of the partition 60 has a shape bent toward the side opposite to the display surface, and FIG. 13 illustrates a modification in which the bent shape is further a rounded bent shape. In these modifications as well, the direction in which stray light is reflected can be changed.

Fourth Embodiment

A fourth embodiment is different from the first embodiment and other embodiments in that the stacked structure constituting the partition 60 includes a material layer constituting an upper layer part and a material layer constituting a lower layer part, which are stacked in this order from the display surface side.

Figure 14:
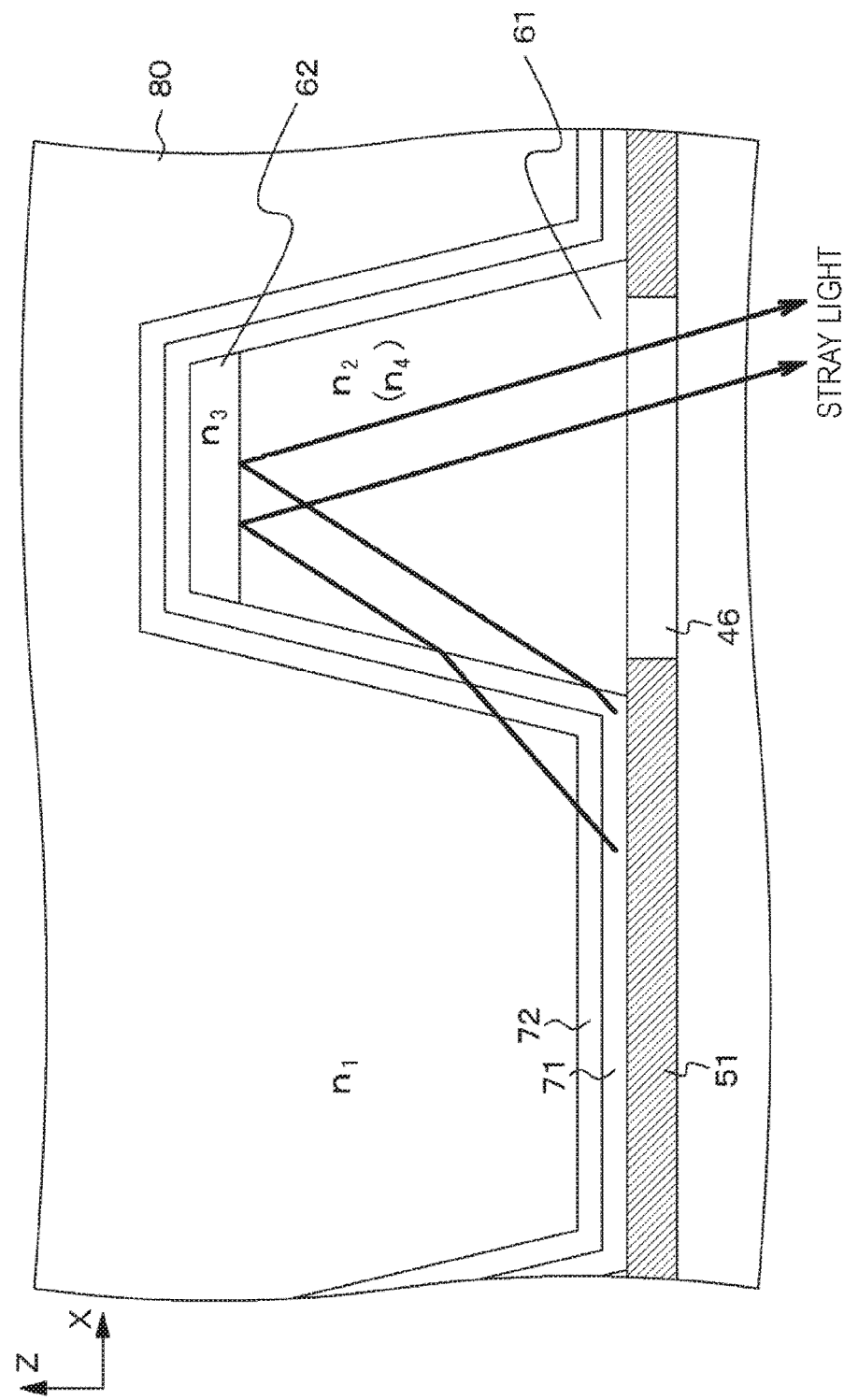
FIG. 14 is a partial schematic cross-sectional view of a display panel for explaining a partition of a fourth embodiment.

FIG. 14 is a partial schematic cross-sectional view of a display panel for explaining a partition of the second embodiment.

A protective layer 80 covering the entire surface including spaces between the partitions 60 similarly to the other embodiments is provided on an upper part of the partition 60. The stacked structure constituting the partition 60 includes a material layer constituting an upper layer part and a material layer constituting a lower layer part, which are stacked in this order from the display surface side, in which the material layer constituting the lower layer part includes a material having a refractive index higher than that of the material of the protective layer 80, and the material layer constituting the upper layer part includes a material having a refractive index higher than that of the material of the lower layer part. In other words, the stacked structure is such that the upper layer part in the first embodiment and other embodiments is omitted, and the middle layer in the first embodiment and other embodiments serves as an upper layer part.

This configuration allows the inclined surface of the lower layer part to be longer than that in the first embodiment. Thus, this is advantageous in that the extent to which stray light is captured in the partition is increased.

Fifth Embodiment

A fourth embodiment is different from the first embodiment and other embodiments, in that the cross sections of the partitions 60 taken along a virtual plane perpendicular to the longitudinal direction of the partitions 60 have a tapered shape with the width increasing toward the display surface.

Figure 15:
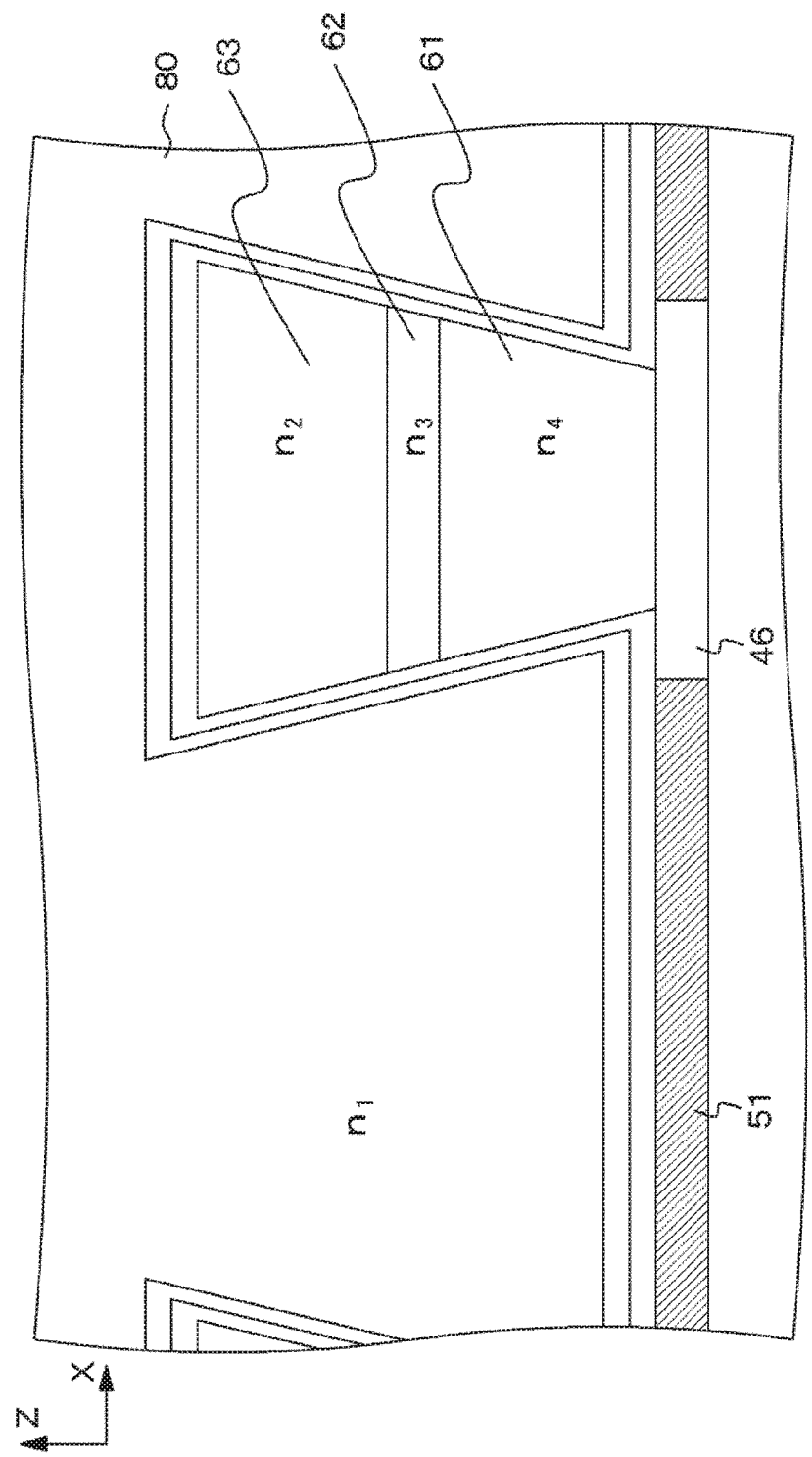
FIG. 15 is a partial schematic cross-sectional view of a display panel for explaining a partition of a fifth embodiment.

FIG. 15 is a partial schematic cross-sectional view of a display panel for explaining a partition of the fifth embodiment.

This configuration corresponds to a configuration obtained by changing the partition 60 in the first embodiment into a reversely tapered shape. Such partitions 60 can be obtained by changing the flow rate and the direction of etching gas in the etching process described with reference to FIG. 5A. Thus, the formation of the partitions 60 into the reversely tapered shape increases the extent to which stray light is captured in the partitions.

Sixth Embodiment

A sixth embodiment is characterized in that the cross sections of the partitions 60 taken along a virtual plane perpendicular to the longitudinal direction of the partitions 60 have a tapered shape with the width increasing toward the display surface, and in that the partitions 60 are each constituted by a single material layer.

Figure 16:
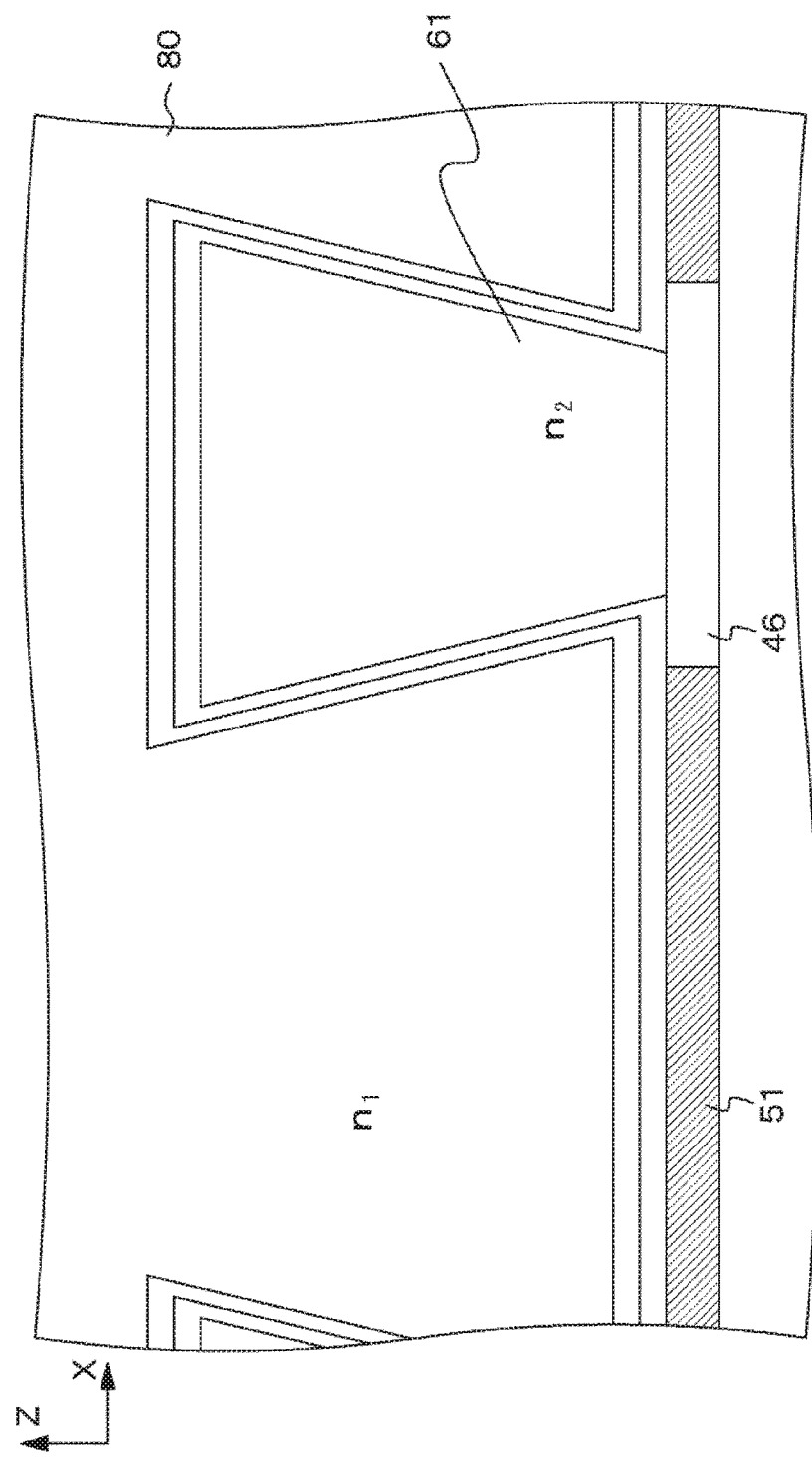
FIG. 16 is a partial schematic cross-sectional view of a display panel for explaining a partition of a sixth embodiment.

FIG. 16 is a partial schematic cross-sectional view of a display panel for explaining a partition of the sixth embodiment.

The cross section of the partition 60 taken along a virtual plane perpendicular to the longitudinal direction of the partition 60 has a tapered shape with the width increasing toward the display surface. A protective layer 80 covering the entire surface including spaces between the partitions 60 similarly to the other embodiments is provided on an upper part of the partition 60. In addition, the partition 60 is constituted by a single material layer, and the material layer constituting the partition 60 includes a material having a refractive index higher than that of the material of the protective layer 80.

With this configuration as well, the formation of the partitions 60 into the reversely tapered shape increases the extent to which stray light is captured in the partitions. In addition, this is advantageous in that the partitions 60 can be made of a single material.

[Electronic Device]

The display devices according to the present disclosure can be used for display units (display devices) of electronic devices in all fields for displaying a video signal input to the electronic devices or a video signal generated in the electronic devices in the form of an image or video. For example, the display devices can be used for display units of television sets, digital still cameras, notebook-sized personal computers, portable terminal devices such as mobile phones, video cameras, head mounted displays (displays worn on the head), and the like.

The display devices of the present disclosure include those of a modular form having a sealed configuration. For example, a display module formed by adhering a part including transparent glass or the like opposed to a pixel array part to the pixel array part is applicable. Note that a display module may be provided with a circuit unit, a flexible printed circuit (FPC) or the like for inputting and outputting signals to a pixel array part from outside. Hereinafter, a digital still camera and a head mounted display will be presented as examples of an electronic device having a display device of the present disclosure. Note that the examples presented here are merely exemplary, and the present disclosure is not limited thereto.

Example 1

Figure 17A:
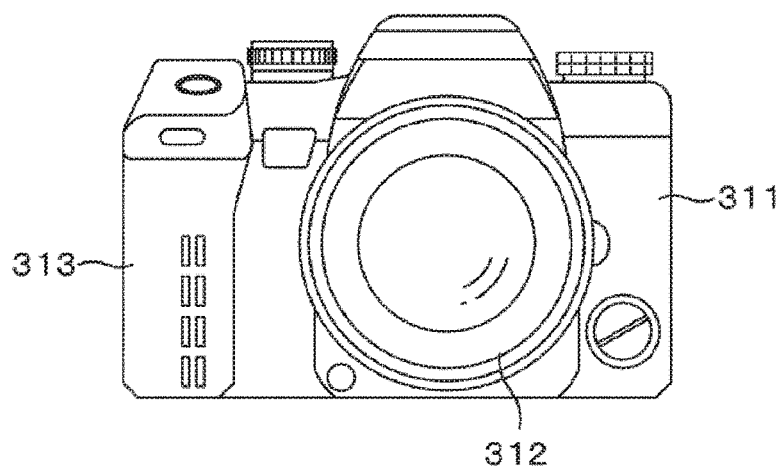
FIG. 17A is a front view thereof and FIG. 17B is a rear view thereof.
Figure 17B:
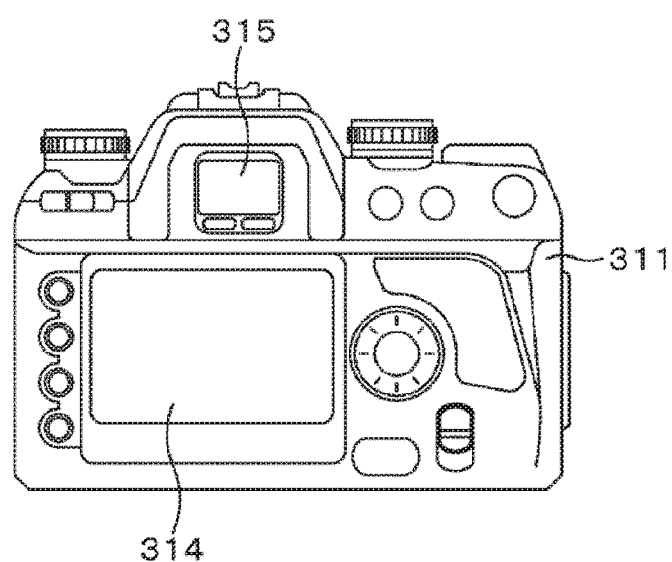

FIG. 17 illustrates external views of a single-lens reflex digital still camera with interchangeable lenses, in which FIG. 17A is a front view thereof and FIG. 17B is a rear view thereof. The single-lens reflex digital still camera with interchangeable lenses has an interchangeable photographing lens unit (interchangeable lens) 312 on the right side at the front of a camera body part (camera body) 311, and a grip part 313 to be gripped by a photographer, for example.

In addition, a monitor 314 is provided approximately at the center of a rear face of the camera body part 311. A viewfinder (eyepiece window) 315 is provided above the monitor 314. A photographer can view an optical image of a subject provided through the photographing lens unit 312 and determine the composition by looking through the viewfinder 315.

In the single-lens reflex digital still camera with interchangeable lenses having the configuration described above, a display device of the present disclosure can be used for the viewfinder 315. Thus, the single-lens reflex digital still camera with interchangeable lenses according to the present example is fabricated with use of a display device of the present disclosure as the viewfinder 315.

Example 2

Figure 18:
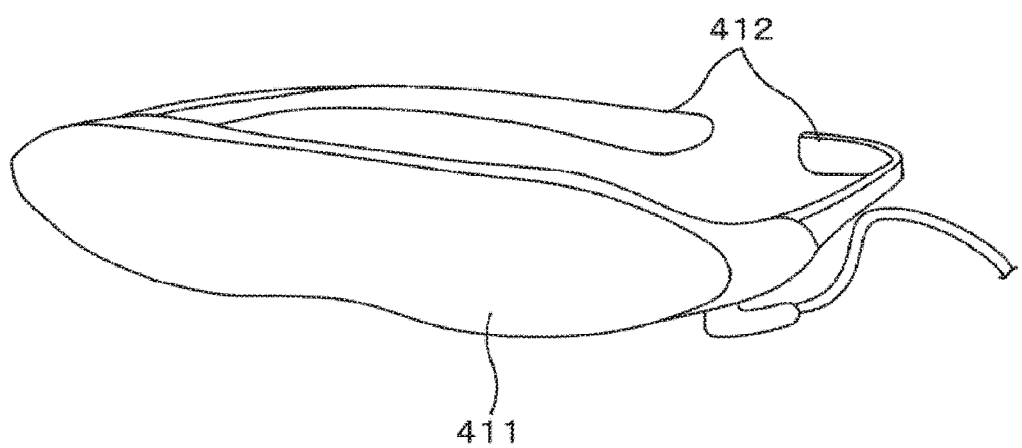
FIG. 18 is an external view of a head mounted display.

FIG. 18 is an external view of a head mounted display. The head mounted display has ear worn parts 412 for mounting on the head of a user on both sides of a glasses type display unit 411, for example. In the head mounted display, a display device of the present disclosure can be used for the display unit 411. Thus, the head mounted display according to the present example is fabricated with used of a display device of the present disclosure as the display unit 411.

Example 3

Figure 19:
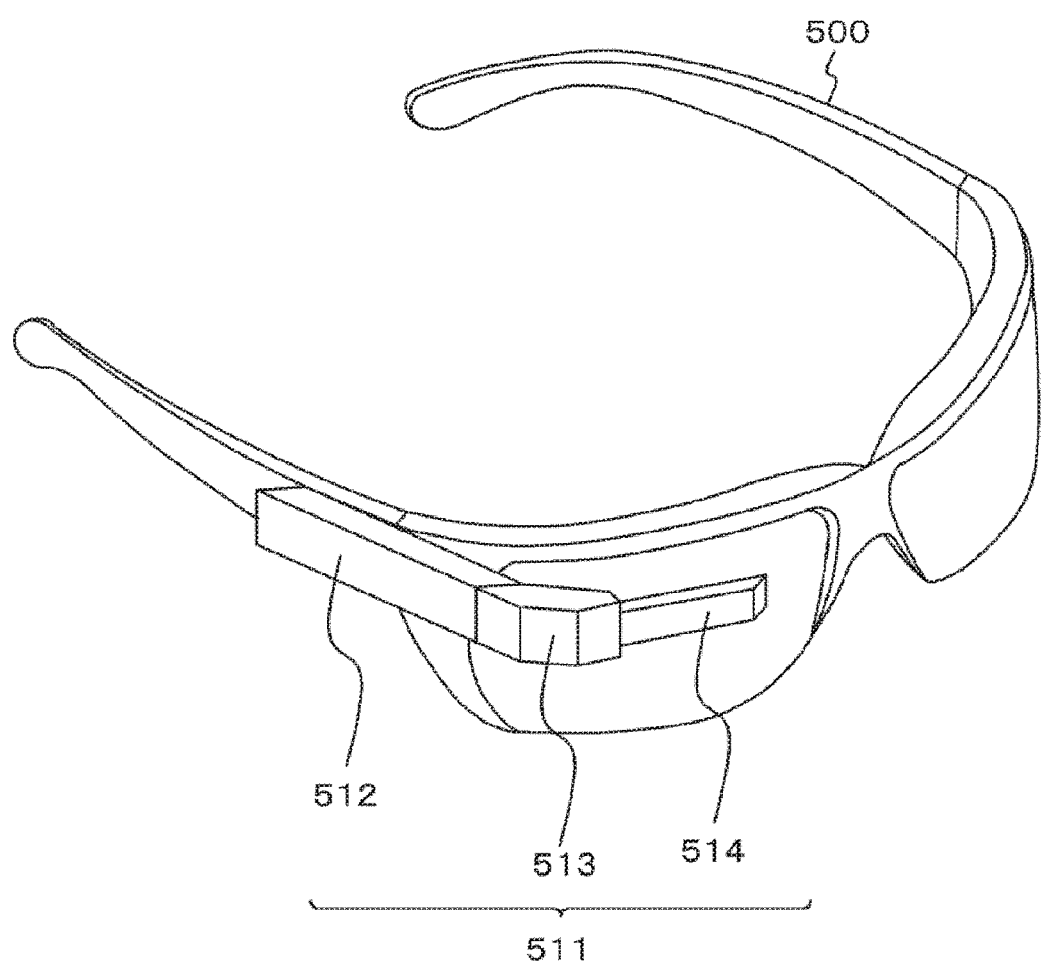
FIG. 19 is an external view of a see-through head mounted display.

FIG. 19 is an external view of a see-through head mounted display. The see-through head mounted display 511 is constituted by a body part 512, an arm 513, and a lens barrel 514.

The body part 512 is connected with the arm 513 and eyeglasses 500. Specifically, an end of the body part 512 in the longitudinal direction is coupled with the arm 513, and one side surface of the body part 512 is coupled with the eyeglasses 500 with a connection member therebetween. Note that the body part 512 may be directly mounted on a human head.

The body part 512 includes a control board for controlling the operation of the see-through head mounted display 511 and a display unit. The arm 513 connects the body part 512 with the lens barrel 514, and supports the lens barrel 514. Specifically, the arm 513 is coupled with an end of the body part 512 and with an end of the lens barrel 514 to fix the lens barrel 514. In addition, the arm 513 includes a signal line for communication of data on images provided from the body part 512 to the lens barrel 514.

The lens barrel 514 emits image light, which is provided from the body part 512 via the arm 513, through an eyepiece toward the eyes of the user wearing the see-through head mounted display 511 In the see-through head mounted display 511, a display device of the present disclosure can be used for the display unit of the body part 512.

Others

It should be noted that the present disclosure may also be embodied in the configurations below.

[1]

A display panel including display elements each including a light emitting unit and a drive circuit for driving the light emitting unit, the display elements being arranged in a two-dimensional matrix on a substrate, in which a partition for guiding stray light from a light emitting unit to an optical sensor provided on the display panel is provided between adjacent light emitting units.

[2]

The display panel according to [1], in which a cross section of each of the partitions taken along a virtual plane perpendicular to a longitudinal direction of the partition has a tapered shape with a width decreasing toward a display surface or a tapered shape with a width increasing toward the display surface.

[3]

The display panel according to [2], in which the partitions each have a stacked structure of two or more layers.

[4]

The display panel according to [3], in which a protective layer covering an entire surface including spaces between partitions is provided on an upper part of the partitions, and a stacked structure constituting each of the partitions includes a material layer constituting an upper layer part, a material layer constituting a middle layer part, and a material layer constituting a lower layer part stacked in this order from a display surface side.

[5]

The display panel according to [4], in which the material layer constituting the upper layer part includes a material having a refractive index lower than that of a material of the protective layer, and the material layer constituting the lower layer part includes a material having a refractive index higher than that of the material of the protective layer.

[6]

The display panel according to [5], in which the material layer constituting the middle layer part includes a material having a refractive index lower than that of the material of the lower layer part.

[7]

The display panel according to [4], in which the material layer constituting the upper layer part includes a material having a refractive index higher than that of the protective layer, the material layer constituting the lower layer part includes the same material as the upper layer part, and the material layer constituting the middle layer part includes a material having a refractive index higher than that of the material of the upper layer part and the lower layer part.

[8]

The display panel according to any one of [4] to [7], in which a cross-sectional shape of an interface between the lower layer part and the middle layer part taken along a virtual plane perpendicular to the longitudinal direction of the partition has at least one bent portion.

[9]

The display panel according to [2], in which a protective layer covering an entire surface including spaces between partitions is provided on an upper part of the partitions, a stacked structure constituting each of the partitions includes a material layer constituting an upper layer part and a material layer constituting a lower layer part stacked in this order from a display surface side, the material layer constituting the lower layer part includes a material having a refractive index higher than that of a material of the protective layer, and the material layer constituting the upper layer part includes a material having a refractive index higher than that of the material of the lower layer part.

[10]

The display panel according to [2], in which the cross section of each of the partitions taken along the virtual plane perpendicular to the longitudinal direction of the partition has a tapered shape with a width increasing toward the display surface, a protective layer covering an entire surface including spaces between partitions is provided on an upper part of the partitions, the partitions are each constituted by a single material layer, and a material layer constituting the partitions includes a material having a refractive index higher than that of a material of the protective layer.

[11]

The display panel according to any one of [1] to [10], in which the display elements are formed on a semiconductor substrate, and optical sensors are respectively formed in association with the display elements on the semiconductor substrate.

[12]

The display panel according to any one of [1] to [11], in which the partitions and the optical sensors are arranged so that stray light from a display element is guided to an optical sensor associated with the display element and that stray light from a display element not being associated with an optical sensor is not guided to the optical sensor.

[13]

A display device including:

a display panel including display elements each including a light emitting unit and a drive circuit for driving the light emitting unit, the display elements being arranged in a two-dimensional matrix on a substrate; and a luminance correction unit for correcting luminances of the display elements in display of an image by the display panel by correcting a gradation value of a video signal, in which a partition for guiding stray light from a light emitting unit to an optical sensor provided on the display panel is provided between adjacent light emitting units of the display panel, and the luminance correction unit corrects a gradation value of a video signal associated with each of the display elements on the basis of a gradation value of an uncorrected video signal and a detection result from the optical sensor.

[14]

The display device according to [13], in which a cross section of each of the partitions taken along a virtual plane perpendicular to a longitudinal direction of the partition has a tapered shape with a width decreasing toward a display surface or a tapered shape with a width increasing toward the display surface.

[15]

The display device according to [14], in which the partitions each have a stacked structure of two or more layers.

[16]

The display device according to [15], in which a protective layer covering an entire surface including spaces between partitions is provided on an upper part of the partitions, and a stacked structure constituting each of the partitions includes a material layer constituting an upper layer part, a material layer constituting a middle layer part, and a material layer constituting a lower layer part stacked in this order from a display surface side.

[17]

The display device according to [16], in which the material layer constituting the upper layer part includes a material having a refractive index lower than that of a material of the protective layer, and the material layer constituting the lower layer part includes a material having a refractive index higher than that of the material of the protective layer.

[18]

The display device according to [17], in which the material layer constituting the middle layer part includes a material having a refractive index lower than that of the material of the lower layer part.

[19]

The display device according to [16], in which the material layer constituting the upper layer part includes a material having a refractive index higher than that of the protective layer, the material layer constituting the lower layer part includes the same material as the upper layer part, and the material layer constituting the middle layer part includes a material having a refractive index higher than that of the material of the upper layer part and the lower layer part.

[20]

The display device according to any one of [16] to [19], in which a cross-sectional shape of an interface between the lower layer part and the middle layer part taken along a virtual plane perpendicular to the longitudinal direction of the partition has at least one bent portion.

[21]

The display device according to [14], in which a protective layer covering an entire surface including spaces between partitions is provided on an upper part of the partitions, a stacked structure constituting each of the partitions includes a material layer constituting an upper layer part and a material layer constituting a lower layer part stacked in this order from a display surface side, the material layer constituting the lower layer part includes a material having a refractive index higher than that of a material of the protective layer, and the material layer constituting the upper layer part includes a material having a refractive index higher than that of the material of the lower layer part.

[22]

The display device according to [14], in which the cross section of each of the partitions taken along the virtual plane perpendicular to the longitudinal direction of the partition has a tapered shape with a width increasing toward the display surface, a protective layer covering an entire surface including spaces between partitions is provided on an upper part of the partitions, the partitions are each constituted by a single material layer, and a material layer constituting the partitions includes a material having a refractive index higher than that of a material of the protective layer.

[23]

The display device according to any one of [13] to [22], in which the display elements are formed on a semiconductor substrate, and optical sensors are respectively formed in association with the display elements on the semiconductor substrate.

[24]

The display device according to anyone of [13] to [23], in which the partitions and the optical sensors are arranged so that stray light from a display element is guided to an optical sensor associated with the display element and that stray light from a display element not being associated with an optical sensor is not guided to the optical sensor.

[25]

An electronic device including a display device, in which the display device includes:

a display panel including display elements each including a light emitting unit and a drive circuit for driving the light emitting unit, the display elements being arranged in a two-dimensional matrix on a substrate; and a luminance correction unit for correcting luminances of the display elements in display of an image by the display panel by correcting a gradation value of a video signal, in which a partition for guiding stray light from a light emitting unit to an optical sensor provided on the display panel is provided between adjacent light emitting units of the display panel, and the luminance correction unit corrects a gradation value of a video signal associated with each of the display elements on the basis of a gradation value of an uncorrected video signal and a detection result from the optical sensor.

[26]

The electronic device according to [25], in which a cross section of each of the partitions taken along a virtual plane perpendicular to a longitudinal direction of the partition has a tapered shape with a width decreasing toward a display surface or a tapered shape with a width increasing toward the display surface.

[27]

The electronic device according to [26], in which the partitions each have a stacked structure of two or more layers.

[28]

The electronic device according to [27], in which a protective layer covering an entire surface including spaces between partitions is provided on an upper part of the partitions, and a stacked structure constituting each of the partitions includes a material layer constituting an upper layer part, a material layer constituting a middle layer part, and a material layer constituting a lower layer part stacked in this order from a display surface side.

[29]

The electronic device according to [28], in which the material layer constituting the upper layer part includes a material having a refractive index lower than that of a material of the protective layer, and the material layer constituting the lower layer part includes a material having a refractive index higher than that of the material of the protective layer.

[30]

The electronic device according to [29], in which the material layer constituting the middle layer part includes a material having a refractive index lower than that of the material of the lower layer part.

[31]

The electronic device according to [28], in which the material layer constituting the upper layer part includes a material having a refractive index higher than that of the protective layer, the material layer constituting the lower layer part includes the same material as the upper layer part, and the material layer constituting the middle layer part includes a material having a refractive index higher than that of the material of the upper layer part and the lower layer part.

[32]

The electronic device according to any one of [28] to [31], in which a cross-sectional shape of an interface between the lower layer part and the middle layer part taken along a virtual plane perpendicular to the longitudinal direction of the partition has at least one bent portion.

[33]

The electronic device according to [26], in which a protective layer covering an entire surface including spaces between partitions is provided on an upper part of the partitions, a stacked structure constituting each of the partitions includes a material layer constituting an upper layer part and a material layer constituting a lower layer part stacked in this order from a display surface side, the material layer constituting the lower layer part includes a material having a refractive index higher than that of a material of the protective layer, and the material layer constituting the upper layer part includes a material having a refractive index higher than that of the material of the lower layer part.

[34]

The electronic device according to [26], in which the cross section of each of the partitions taken along the virtual plane perpendicular to the longitudinal direction of the partition has a tapered shape with a width increasing toward the display surface, a protective layer covering an entire surface including spaces between partitions is provided on an upper part of the partitions, the partitions are each constituted by a single material layer, and a material layer constituting the partitions includes a material having a refractive index higher than that of a material of the protective layer.

[35]

The electronic device according to any one of [25] to [34], in which the display elements are formed on a semiconductor substrate, and optical sensors are respectively formed in association with the display elements on the semiconductor substrate.

[36]

The electronic device according to any one of [25] to [35], in which the partitions and the optical sensors are arranged so that stray light from a display element is guided to an optical sensor associated with the display element and that stray light from a display element not being associated with an optical sensor is not guided to the optical sensor.

REFERENCE SIGNS LIST

1 Display device
2 Display panel
3 Display element
4 Optical sensor
10 Semiconductor substrate
11 Well
12 Element isolation region
21 Gate electrode of drive transistor
22 Gate insulating layer of drive transistor
30 Contact hole
31 Electrode constituting wire or capacitor
41, 42, 43, 44, 45
46 Insulating layer or interlayer insulating layer
51 Anode electrode of light emitting unit
60 Partition
61 Lower layer part of partition
62 Middle layer part of partition
63 Upper layer part of partition
71 Organic layer
72 Cathode electrode
80 Protective layer (flattening film)
90, 91 Mask
100 Power supply unit
101 Scanning unit
102 Data driver
103 Emission control unit
110 Luminance correction unit
110A A/D converter
110B Correction value calculation unit
110C Reference value storage table unit
110D Multiplication unit
311 Camera body part
312 Photographing lens unit
313 Grip part
314 Monitor
315 Viewfinder
500 Eyeglasses
511 See-through head mounted display
512 Body part
513 Arm
514 Lens barrel
$TR_W$ Write transistor
$TR_D$ Drive transistor
$TR_{EL}$ Emission control transistor
$C_1$ Capacitor
$C_2$ Auxiliary capacitor
ELP Organic electroluminescent light emitting unit
$C_{EL}$ Capacitance of light emitting unit ELP SCL Scanning line
DTL Data line
PS1 Power supply line
PS2 Common power supply line
CL1 Emission control line

The invention claimed is:

1. A display panel comprising:
   light emitting elements between a substrate and a protective layer, a first one of the light emitting elements is configured to emit a first light emission through the protective layer;
   a sensor in the substrate, the sensor is configured to detect stray light that is emitted from the first one of the light emitting elements; and
   a partition between the substrate and the protective layer, the partition is between the first one of the light emitting elements and a second one of the light emitting elements,
   wherein a refraction index of the protective layer is higher than a refraction index of the partition.

2. The display panel according to claim 1, wherein a middle layer part of the partition is between the protective layer and a lower layer part of the partition.

3. The display panel according to claim 1, wherein a refraction index of the middle layer part is lower than a refraction index of the lower layer part.

4. The display panel according to claim 3, wherein an upper layer part of the partition is between the protective layer and the middle layer part.

5. The display panel according to claim 4, wherein the middle layer part is between the upper layer part and the lower layer part.

6. The display panel according to claim 4, wherein the refraction index of the protective layer is higher than a refraction index of the upper layer part.

7. The display panel according to claim 6, wherein the refraction index of the upper layer part is higher than the refraction index of the middle layer part.

8. The display panel according to claim 6, wherein the refraction index of the middle layer part is between the refraction index of the lower layer part and the refraction index of the upper layer part.

9. The display panel according to claim 2, wherein a boundary between the lower layer part and the middle layer part is configured to reflect the stray light toward the first one of the sensors.

10. The display panel according to claim 9, wherein the boundary between the lower layer part and the middle layer part is a bent shape.

11. The display panel according to claim 1, wherein the second one of the light emitting elements is configured to emit a second light emission through the protective layer.

12. A display device comprising:
    the display panel according to claim 1; and
    a luminance correction unit configured to correct a luminance of the light emitting units.

* * * * *